United States Patent
Mamuye et al.

(10) Patent No.: US 11,104,847 B2
(45) Date of Patent: Aug. 31, 2021

(54) CADMIUM FREE BLUE ABSORBING II-VI QUANTUM DOTS FOR THIN FILM APPLICATIONS

(71) Applicant: Nanosys, Inc., Milpitas, CA (US)

(72) Inventors: Ashenafi Damtew Mamuye, Milpitas, CA (US); Christopher Sunderland, San Jose, CA (US); Chunming Wang, Milpitas, CA (US)

(73) Assignee: Nanosys, Inc., Milpitas, CA (US)

(*) Notice: Subject to any disclaimer, the term of this patent is extended or adjusted under 35 U.S.C. 154(b) by 58 days.

(21) Appl. No.: 16/751,646

(22) Filed: Jan. 24, 2020

(65) Prior Publication Data

US 2020/0291296 A1  Sep. 17, 2020

Related U.S. Application Data

(60) Provisional application No. 62/796,274, filed on Jan. 24, 2019.

(51) Int. Cl.

| | |
|---|---|
| *C09K 11/88* | (2006.01) |
| *C09K 11/02* | (2006.01) |
| *H01L 33/50* | (2010.01) |
| *B82Y 40/00* | (2011.01) |
| *B82Y 20/00* | (2011.01) |

(52) U.S. Cl.
CPC ............ *C09K 11/883* (2013.01); *C09K 11/02* (2013.01); *H01L 33/502* (2013.01); *B82Y 20/00* (2013.01); *B82Y 40/00* (2013.01)

(58) Field of Classification Search
CPC ..... C09K 11/882; C09K 11/02; H01L 33/502; B82Y 20/00; B82Y 40/00
See application file for complete search history.

(56) References Cited

U.S. PATENT DOCUMENTS 8,637,082 B2 * 1/2014 Tulsky .................. B82Y 30/00
                                                  424/489

FOREIGN PATENT DOCUMENTS

CN          105315996          *    2/2016

OTHER PUBLICATIONS

Translation for CN 105315996, dated Feb. 10, 2016.*
Cadirci, M., et al., "Ultrafast exciton dynamics in Type II ZnTe—ZnSe colloidal quantum dot," *Phys Chem Chem Phys* 14(39): 13638-13645, Royal Society of Chemistry, United Kingdom (2012).
Wang, A., et al., "Bright, efficient, and color-stable violet ZnSe-based quantum dot light-emitting diodes," *Nanoscale* 7:2951-2959, Royal Society of Chemistry, United Kingdom (2015).

* cited by examiner

*Primary Examiner* — C Melissa Koslow
(74) *Attorney, Agent, or Firm* — Sterne, Kessler, Goldstein & Fox P.L.L.C.

(57) ABSTRACT

The invention pertains to the field of nanotechnology. More particularly, the invention relates to highly luminescent nanostructures, particularly highly luminescent nanostructures comprising a ZnTe core and CdS, CdSe, CdTe, ZnS, ZnSe, or ZnTe shell layers. The nanostructures show strong absorbance at 450 nm and have a high $OD_{450}$/mass ratio. The invention also relates to methods of producing such nanostructures.

20 Claims, 9 Drawing Sheets

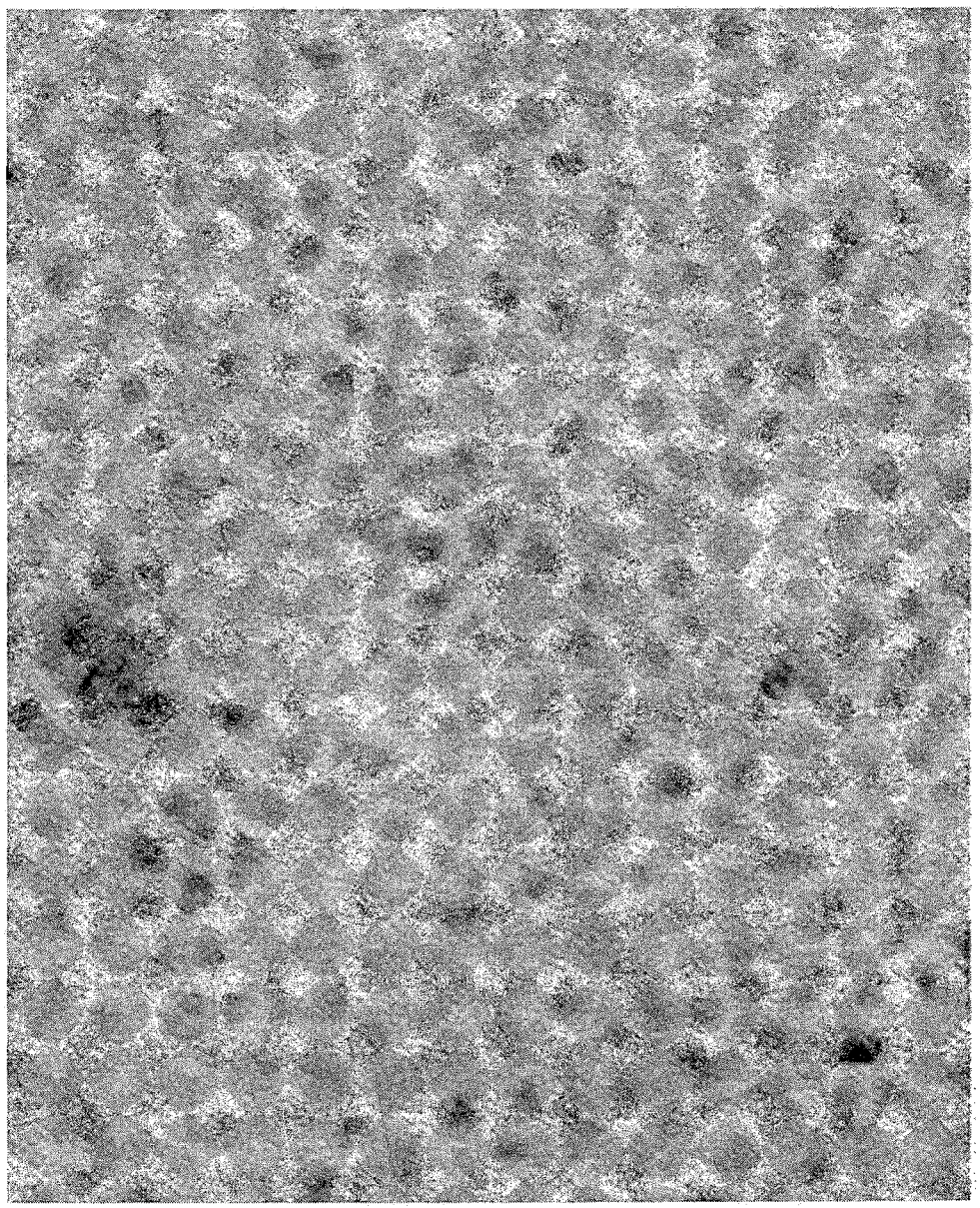

CADMIUM FREE BLUE ABSORBING II-VI QUANTUM DOTS FOR THIN FILM APPLICATIONS

BACKGROUND OF THE INVENTION

Field of the Invention

The invention pertains to the field of nanotechnology. More particularly, the invention relates to highly luminescent nanostructures, particularly highly luminescent nanostructures comprising a ZnTe core and CdS, CdSe, CdTe. ZnS, ZnSe, or ZnTe shell layers. The nanostructures show strong absorbance at 450 nm and have a high $OD_{450}$/mass ratio. The invention also relates to methods of producing such nanostructures.

Background Art

Tuning the absorbance and emission properties of quantum dots (QDs) for high concentration color conversion applications is critical to their performance. For color conversion applications, efficient absorbance of excitation wavelengths emitted by the blue light emitting diode (LED) backlight is critical to achieving both high photoconversion efficiency (PCE) and high color gamut coverage. Moreover, due to the high optical density of the color conversion layer, controlling other quantum dot optical properties including emission wavelength (PWL), emission linewidth (FWHM), Stokes shift, and photoluminescence quantum yield (PLQY) are equally critical to PCE and film emission wavelength.

To exploit the full potential of nanostructures in applications such as films and displays, the nanostructures need to simultaneously meet five criteria: narrow and symmetric emission spectra, high photoluminescence (PL) quantum yields (QYs), high optical stability, eco-friendly materials, and low-cost methods for mass production. Most previous studies on highly emissive and color-tunable quantum dots have concentrated on materials containing cadmium, mercury, or lead. Wang, A., et al., *Nanoscale* 7:2951-2959 (2015). For example, quantum dots composed of CdSe or $CsPbBr_3$ are known to possess high per mass absorption coefficients at 450 nm and tunable PWL; however, there are increasing concerns that toxic materials such as cadmium, mercury, or lead would pose serious threats to human health and the environment. And, the European Union's Restriction of Hazardous Substances rules ban any consumer electronics containing more than trace amounts of these materials. Therefore, there is a need to produce materials that are free of cadmium, mercury, and lead for color conversion applications.

For the development of thin film (e.g., <10 μm) emissive films, strong absorption at 450 nm is required. For InP/ZnSe/ZnS core/shell(s) quantum dots, absorption at 450 nm is typically a limiting factor in the use of this material.

A need exists to prepare nanostructures and nanostructure compositions for use in color conversion applications that have high blue light absorption efficiency, controllable emission wavelength, high photoluminescence quantum yield, and narrow FWHM.

BRIEF SUMMARY OF THE INVENTION

The present invention describes a nanostructure comprising a core surrounded by at least one shell, wherein the core comprises ZnTe, and wherein the nanostructure exhibits an optical density at 450 nm on a per mass basis of between about 0.4 $cm^2$/mg and about 1.5 $cm^2$/mg.

In some embodiments, the peak emission wavelength of the nanostructure is between about 400 nm and about 650 nm. In some embodiments, the peak emission wavelength of the nanostructure is between about 500 nm and about 550 nm. In some embodiments, the peak emission wavelength of the nanostructure is between about 510 nm and about 530 nm.

In some embodiments, the core of the nanostructure is doped with at least one metal ion selected from the group consisting of indium, gallium, aluminum, selenium, titanium, tin, chlorine, and fluorine.

In some embodiments, the core of the nanostructure is alloyed with at least one metal ion selected from the group consisting of cadmium, mercury, magnesium, sulfur, and selenium.

In some embodiments, the core of the nanostructure has a diameter of between about 3 nm and about 6 nm.

In some embodiments, at least one shell of the nanostructure is selected from the group consisting of ZnS, ZnSe, ZnTe, CdS, CdSe, and CdTe. In some embodiments, at least one shell of the nanostructure comprises ZnSe. In some embodiments, at least one shell of the nanostructure comprises ZnS.

In some embodiments, at least one shell of the nanostructure comprises between 2 and 4 monolayers of ZnSe.

In some embodiments, at least one shell of the nanostructure comprises between 1 and 3 monolayers of ZnS.

In some embodiments, the core of the nanostructure is surrounded by two shells.

In some embodiments, the photoluminescence quantum yield of the nanostructure is between 20% and 99%. In some embodiments, the photoluminescence quantum yield of the nanostructure is between 20% and 50%.

In some embodiments, the FWHM of the nanostructure is between about 30 nm and about 40 nm.

In some embodiments, the nanostructure exhibits an optical density at 450 nm on a per mass basis of between about 0.4 $cm^2$/mg and about 1 $cm^2$/mg. In some embodiments, the nanostructure exhibits an optical density at 450 nm on a per mass basis of between about 0.45 $cm^2$/mg and about 0.9 $cm^2$/mg.

In some embodiments, the nanostructure comprises two shells, wherein the first shell comprises ZnSe and the second shell comprises ZnS.

In some embodiments, the nanostructure is a quantum dot.

In some embodiments, a device comprises the nanostructures described herein.

The present invention also describes a method of producing a nanostructure comprising a ZnTe core surrounded by at least one shell comprising:

(a) admixing a first zinc source and at least one solvent to produce a reaction mixture;

(b) contacting the reaction mixture obtained in (a) with a solution comprising a reducing agent and a tellurium source;

(c) admixing a second zinc source and at least one ligand to produce a reaction mixture;

(d) admixing the reaction mixture of (b) with the reaction mixture of (c); and (e) contacting the reaction mixture obtained in (d) with a selenium source;

to produce a nanostructure comprising a ZnTe core surrounded by at least one shell, wherein the nanostructure exhibits an optical density at 450 nm on a per mass basis of between about 0.4 $cm^2$/mg and about 1.5 $cm^2$/mg.

In some embodiments, the first zinc source is a zinc carboxylate.

In some embodiments, the first zinc source is selected from the group consisting of zinc oleate, zinc hexanoate, zinc octanoate, zinc laurate, zinc myristate, zinc palmitate, zinc stearate, zinc dithiocarbamate, and mixtures thereof. In some embodiments, the first zinc source is zinc oleate.

In some embodiments, the at least one solvent in (a) is selected from the group consisting of 1-octadecene, 1-hexadecene, 1-eicosene, eicosane, octadecane, hexadecane, tetradecane, squalene, squalane, trioctylphosphine oxide, trioctylamine, trioctylphosphine, and dioctyl ether. In some embodiments, the at least one solvent in (a) is octadecene or benzyl ether.

In some embodiments, the admixing in (a) is at a temperature between about 20° C. and about 250° C.

In some embodiments, the admixing in (a) further comprises at least one ligand. In some embodiments, the at least one ligand is selected from the group consisting of lauric acid, caproic acid, myristic acid, palmitic acid, stearic acid, and oleic acid. In some embodiments, the at least one ligand is lauric acid.

In some embodiments, the tellurium source in (b) is selected from the group consisting of trioctylphosphine telluride, tri-n-butylphosphine telluride, trimethylphosphine telluride, triphenylphosphine telluride, tricyclohexylphosphine telluride, elemental tellurium, hydrogen telluride, bis(trimethylsilyl) telluride, and mixtures thereof. In some embodiments, the tellurium source in (b) is trioctylphosphine telluride.

In some embodiments, the reducing agent in (b) is selected from the group consisting of diborane, sodium hydride, sodium borohydride, lithium borohydride, sodium cyanoborohydride, calcium hydride, lithium hydride, lithium aluminum hydride, diisobutylaluminum hydride, sodium triethylborohydride, and lithium triethylborohydride. In some embodiments, the reducing agent in (b) is lithium triethylborohydride.

In some embodiments, the second zinc source is a zinc carboxylate. In some embodiments, the second zinc source is selected from the group consisting of zinc oleate, zinc hexanoate, zinc octanoate, zinc laurate, zinc myristate, zinc palmitate, zinc stearate, zinc dithiocarbamate, and mixtures thereof. In some embodiments, the second zinc source is zinc oleate.

In some embodiments, the at least one ligand in (c) is selected from the group consisting of dodecylamine, oleylamine, hexadecylamine, dioctylamine, and octadecylamine. In some embodiments, the at least one ligand in (c) is oleylamine.

In some embodiments, the admixing in (d) is at a temperature between about 20° C. and about 250° C.

In some embodiments, the selenium source in (e) is selected from the group consisting of trioctylphosphine selenide, tri-n-butylphosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof. In some embodiments, the selenium source in (e) is trioctylphosphine selenide.

In some embodiments, the contacting in (e) is at a temperature between about 200° C. and about 310° C.

In some embodiments, the method of producing a nanostructure further comprises:

(f) contacting the reaction mixture in (e) with a sulfur source.

In some embodiments, the temperature is raised, lowered, or maintained in (f) to a temperature between about 200° C. and about 310° C.

In some embodiments, the sulfur source in (f) is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source in (f) is dodecanethiol.

In some embodiments, the method of producing a nanostructure further comprises isolating the nanostructure.

The present invention also discloses a nanostructure composition, comprising:

(a) at least one population of nanostructures, the nanostructures comprising a core and at least one shell, wherein the core comprises ZnTe, and wherein the nanostructure exhibits an optical density at 450 nm on a per mass basis of between about 0.4 $cm^2$/mg and about 1.5 $cm^2$/mg; and (b) at least one organic resin.

In some embodiments, the peak emission wavelength of the nanostructure in the nanostructure composition is between about 400 nm and about 650 nm. In some embodiments, the peak emission wavelength of the nanostructure in the nanostructure composition is between about 500 nm and about 550 nm. In some embodiments the peak emission wavelength of the nanostructure in the nanostructure composition is between about 510 nm and about 530 nm.

In some embodiments, the core of the nanostructure in the nanostructure composition is doped with at least one metal ion selected from the group consisting of indium, gallium, aluminum, selenium, titanium, tin, chlorine, and fluorine.

In some embodiments, the core of the nanostructure in the nanostructure composition is alloyed with at least one metal ion selected from the group consisting of cadmium, mercury, magnesium, sulfur, and selenium.

In some embodiments, the core of the nanostructure in the nanostructure composition has a diameter of between about 3 nm and about 6 nm.

In some embodiments, at least one shell of the nanostructure in the nanostructure composition is selected from the group consisting of ZnS, ZnSe, ZnTe, CdS, CdSe, and CdTe. In some embodiments, at least one shell of the nanostructure in the nanostructure composition comprises ZnSe. In some embodiments, at least one shell of the nanostructure in the nanostructure composition comprises ZnS.

In some embodiments, at least one shell of the nanostructure in the nanostructure composition comprises between 2 and 4 monolayers of ZnSe.

In some embodiments, at least one shell of the nanostructure in the nanostructure composition comprises between 1 and 3 monolayers of ZnS.

In some embodiments, the core of the nanostructure in the nanostructure composition is surrounded by two shells.

In some embodiments, the photoluminescence quantum yield of the nanostructure in the nanostructure composition is between 20% and 99%. In some embodiments, the photoluminescence quantum yield of the nanostructure in the nanostructure composition is between 20% and 50%.

In some embodiments, the FWHM of the nanostructure in the nanostructure composition is between about 30 nm and about 40 nm.

In some embodiments, the nanostructure in the nanostructure composition exhibits an optical density at 450 nm on a per mass basis of between about 0.4 cm$^2$/mg and about 1 cm$^2$/mg. In some embodiments, the nanostructure in the nanostructure composition exhibits an optical density at 450 nm on a per mass basis of between about 0.45 cm$^2$/mg and about 0.9 cm$^2$/mg.

In some embodiments, the nanostructure in the nanostructure composition comprises two shells, the first shell comprises ZnSe and the second shell comprises ZnS.

In some embodiments, the nanostructure in the nanostructure composition is a quantum dot.

In some embodiments, the nanostructure in the nanostructure composition comprises between one and five organic resins.

In some embodiments, the at least one organic resin in the nanostructure composition is a thermosetting resin or a UV curable resin.

In some embodiments, the at least one organic resin in the nanostructure composition is selected from the group consisting of isobornyl acrylate, tetrahydrofurfuryl acrylate, an ethoxylated phenyl acrylate, lauryl acrylate, stearyl acrylate, octyl acrylate, isodecyl acrylate, tridecyl acrylate, caprolactone acrylate, nonyl phenol acrylate, cyclic trimethylolpropane formal acrylate, a methoxy polyethyleneglycol acrylate, a methoxy polypropyleneglycol acrylate, hydroxyethyl acrylate, hydroxypropyl acrylate, and glycidyl acrylate.

In some embodiments, a molded article comprises the nanostructure composition described herein.

In some embodiments, the molded article is a film, a substrate for a display, or a light emitting diode.

In some embodiments, the molded article is a film.

The present invention also describes a nanostructure film layer comprising:
  (a) at least one population of nanostructures, the nanostructures comprising a core surrounded by at least one shell, wherein the core comprises ZnTe, and wherein the nanostructure exhibits an optical density at 450 nm on a per mass basis of between about 0.4 cm$^2$/mg and about 1.5 cm$^2$/mg; and
  (b) at least one organic resin.

In some embodiments, the nanostructure film layer exhibits a photoconversion efficiency of between about 25% and about 40%.

In some embodiments, the peak emission wavelength of the nanostructures in the nanostructure film layer is between about 400 nm and about 650 nm. In some embodiments, the peak emission wavelength of the nanostructures in the nanostructure film layer is between about 500 nm and about 550 nm. In some embodiments, the peak emission wavelength of the nanostructures in the nanostructure film layer is between about 510 nm and about 530 nm.

In some embodiments, the core of the nanostructures in the nanostructure film layer is doped with at least one ion selected from the group consisting of indium, gallium, aluminum, selenium, titanium, tin, chlorine, and fluorine.

In some embodiments, the core of the nanostructures in the nanostructure film layer is alloyed with at least one ion selected from the group consisting of cadmium, mercury, magnesium, sulfur, and selenium.

In some embodiments, the core of the nanostructures in the nanostructure film layer has a diameter of between about 3 nm and about 6 nm.

In some embodiments, at least one shell of the nanostructures in the nanostructure film layer is selected from the group consisting of ZnS, ZnSe, ZnTe, CdS, CdSe, and CdTe.

In some embodiments, at least one shell of the nanostructures in the nanostructure film layer comprises ZnSe.

In some embodiments, at least one shell of the nanostructures in the nanostructure film layer comprises ZnS.

In some embodiments, the at least one shell of the nanostructures in the nanostructure film layer comprises between 2 and 4 monolayers of ZnSe.

In some embodiments, the at least one shell of the nanostructure in the nanostructure film layer comprises between 1 and 3 monolayers of ZnS.

In some embodiments, the nanostructures in the nanostructure film layer comprise a core surrounded by two shells.

In some embodiments, the photoluminescence quantum yield of the nanostructures in the nanostructure film layer is between 20% and 99%. In some embodiments, the photoluminescence quantum yield of the nanostructure is between 20% and 50%.

In some embodiments, the FWHM of the nanostructures in the nanostructure film layer is between about 30 nm and about 40 nm.

In some embodiments, the nanostructures in the nanostructure film layer exhibit an optical density at 450 nm on a per mass basis of between about 0.4 cm$^2$/mg and about 1 cm$^2$/mg. In some embodiments, the nanostructures in the nanostructure film layer exhibit an optical density at 450 nm on a per mass basis of between about 0.45 cm$^2$/mg and about 0.9 cm$^2$/mg.

In some embodiments, the nanostructures in the nanostructure film layer comprise two shells, wherein the first shell comprises ZnSe and the second shell comprises ZnS.

In some embodiments, the nanostructures in the nanostructure film layer are quantum dots.

In some embodiments, the nanostructure film layer comprises between one and five organic resins. In some embodiments, the at least one organic resin in the nanostructure film layer is a thermosetting resin or a UV curable resin. In some embodiments, at least one organic resin in the nanostructure film layer is selected from the group consisting of isobornyl acrylate, tetrahydrofurfuryl acrylate, an ethoxylated phenyl acrylate, lauryl acrylate, stearyl acrylate, octyl acrylate, isodecyl acrylate, tridecyl acrylate, caprolactone acrylate, nonyl phenol acrylate, cyclic trimethylolpropane formal acrylate, a methoxy polyethyleneglycol acrylate, a methoxy polypropyleneglycol acrylate, hydroxyethyl acrylate, hydroxypropyl acrylate, and glycidyl acrylate.

In some embodiments, the nanostructure film layer is a color conversion layer in a display device.

BRIEF DESCRIPTION OF THE DRAWINGS

FIG. 9 is a TEM image of ZnTe/ZnSe/ZnS core/shell/shell nanostructures prepared using the method of Example 13.

DETAILED DESCRIPTION OF THE INVENTION

Definitions

Figure 1:
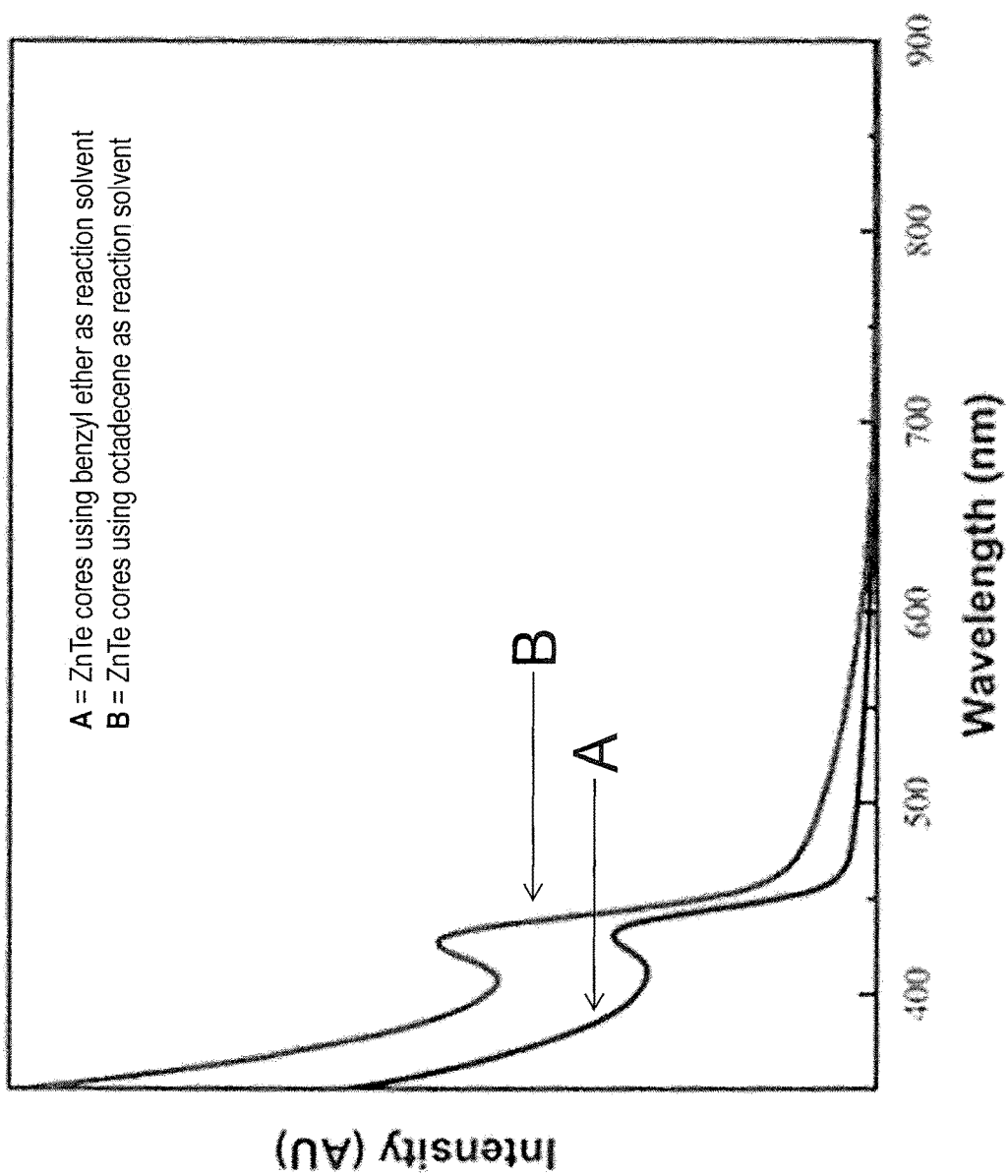
FIG. 1 is an absorption spectrum measuring intensity versus wavelength of ZnTe cores prepared using (A) benzyl ether as the reaction solvent; and (B) octadecene as the reaction solvent with the addition of oleylamine and trioctylphosphine to improve surface passivation.
Figure 2:
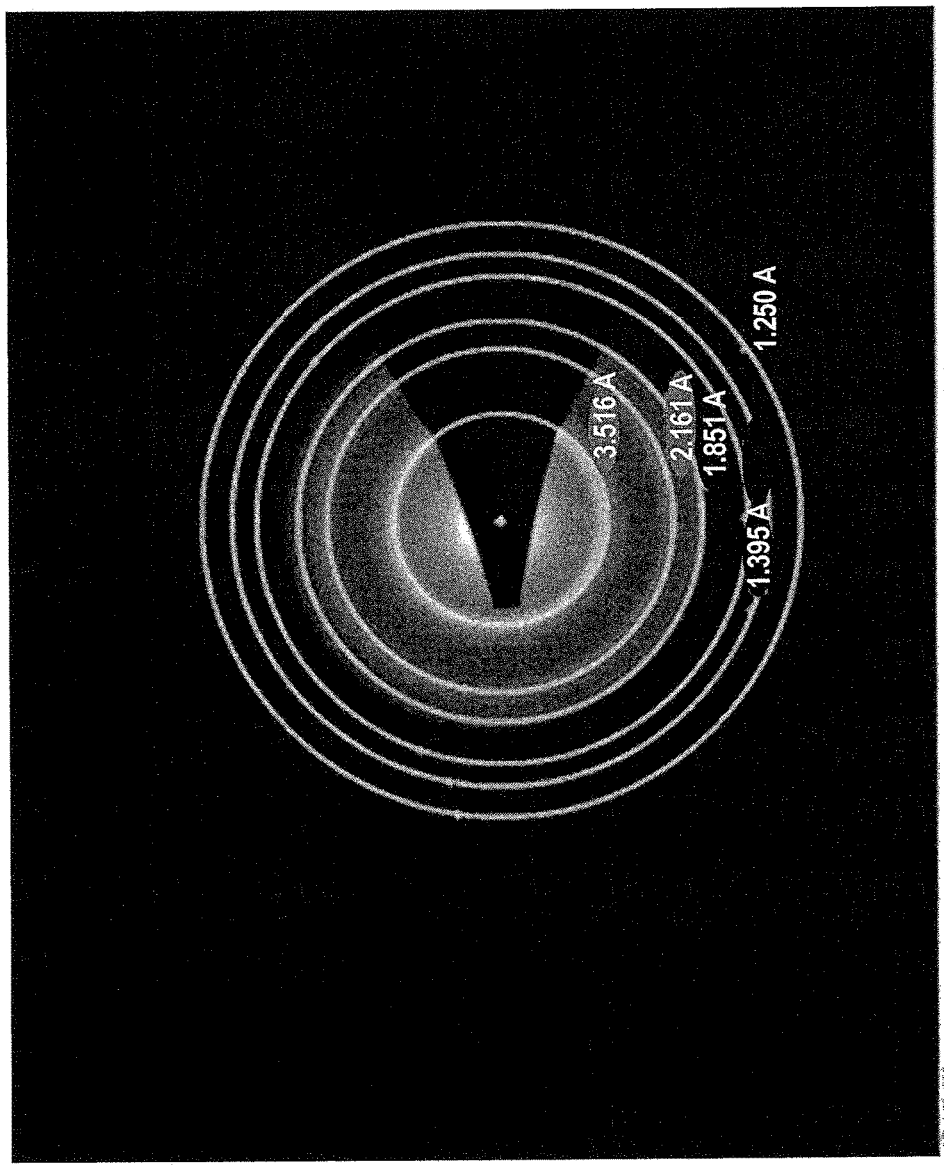
FIG. 2 is an electron diffraction pattern of ZnTe cores prepared using benzyl ether as the reaction solvent with the addition of oleylamine and trioctylphosphine to improve surface passivation (according to the method of Example 5). The electron diffraction pattern was acquired from an ~0.2 μm diameter area. The electron diffraction pattern showed that the cores are pure ZnTe with a cubic structure.
Figure 3:
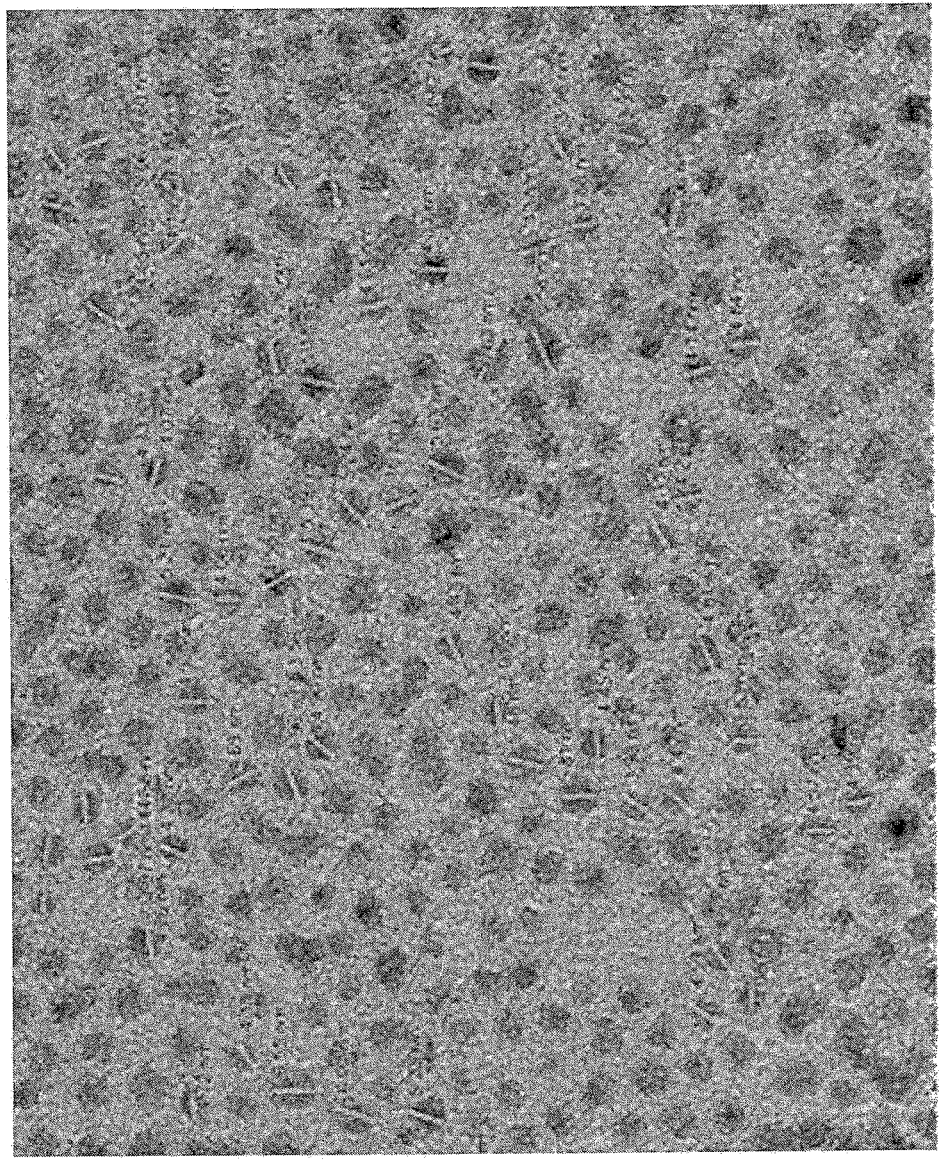
FIG. 3 is a transmission electron microscope (TEM) image of ZnTe cores prepared using benzyl ether as the reaction solvent with the addition of oleylamine and trioctylphosphine to improve surface passivation (according to the method of Example 5). The TEM image contained 68 entries with a deviation (rms)=0.70172 nm.
Figure 4:
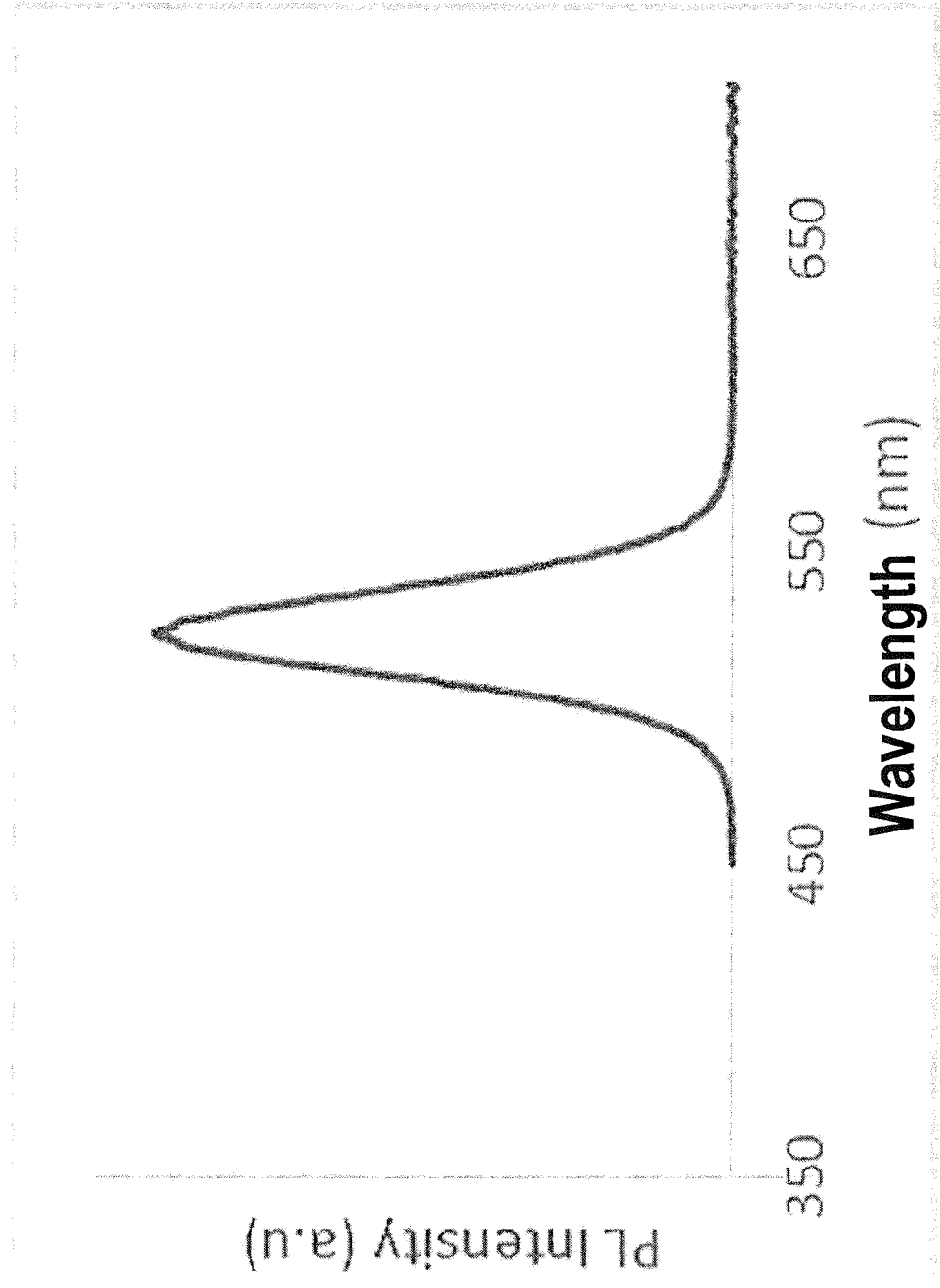
FIG. 4 is a photoluminescence spectrum measuring photoluminescence versus wavelength of ZnTe/ZnSe core/shell nanostructures prepared using the method of Example 8. The nanostructure showed a peak emission wavelength of 523 nm.
Figure 5:
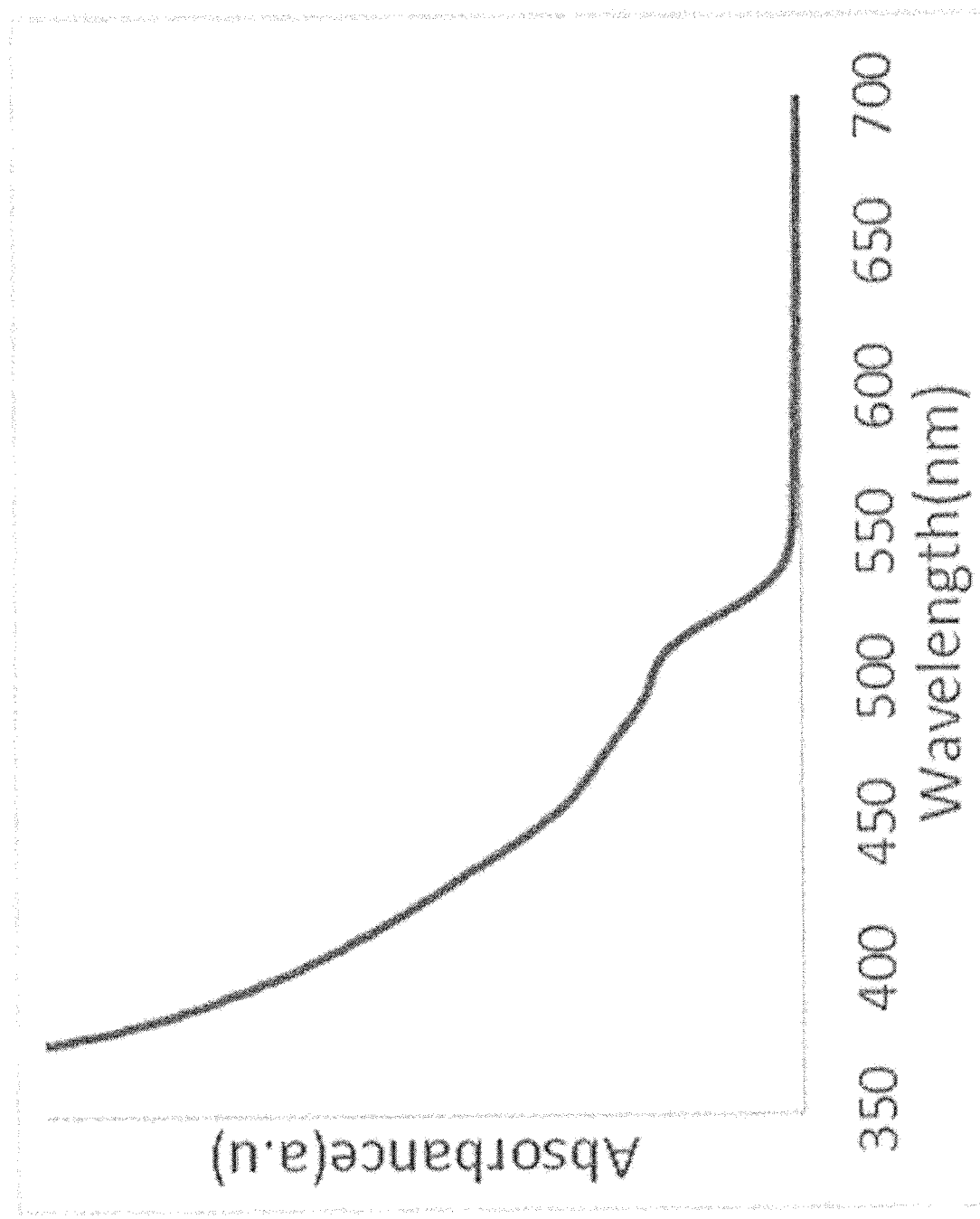
FIG. 5 is an absorption spectrum measuring optical density (OD) versus wavelength of ZnTe/ZnSe coreshell nanostructures prepared using the method of Example 8. The nanostructures showed a peak emission wavelength of 523 nm.
Figure 6:
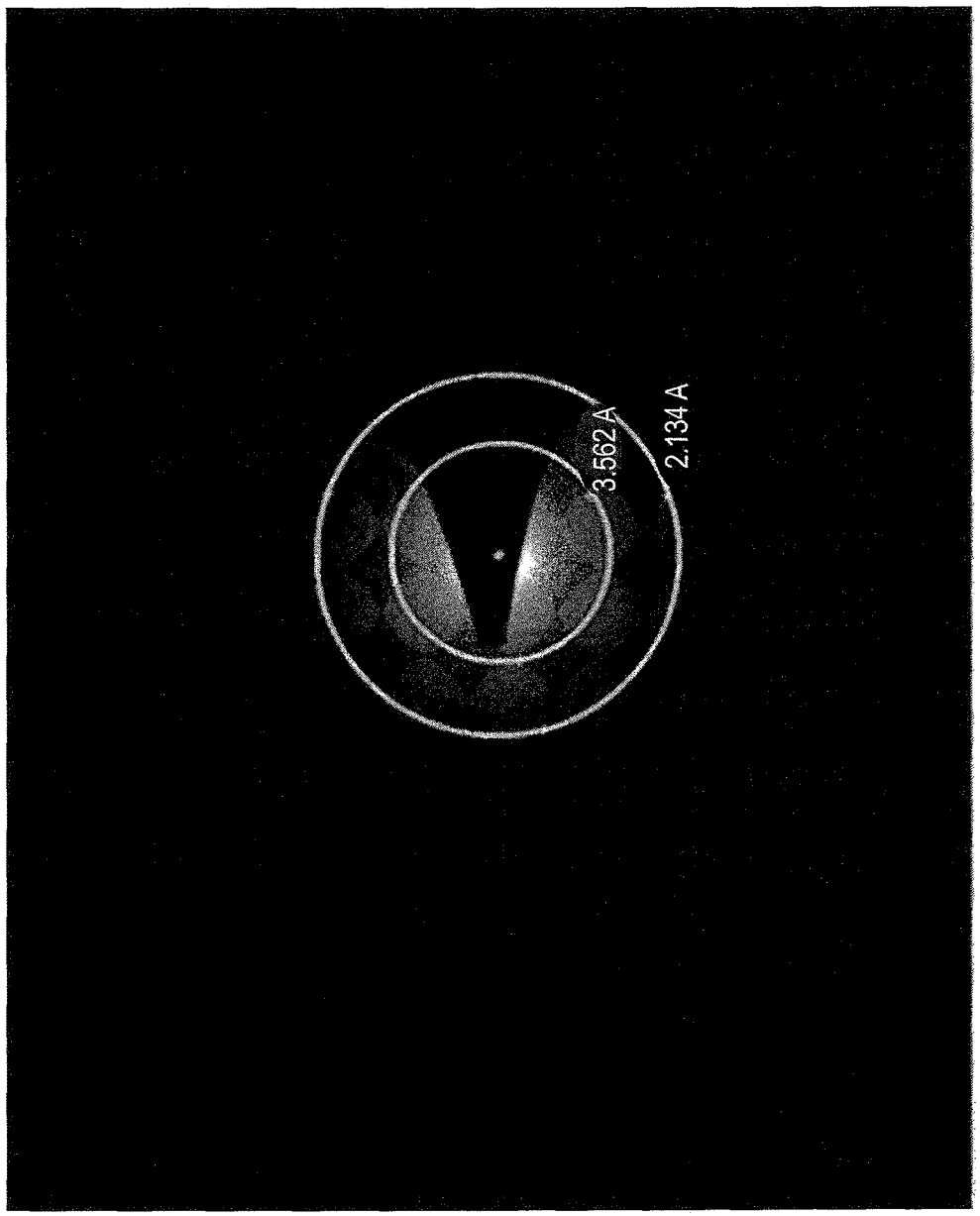
FIG. 6 is an electron diffraction pattern of ZnTe/ZnSe core/shell nanostructures prepared using the method of Example 8. The nanostructures showed a peak emission wavelength of 523 nm.
Figure 7:
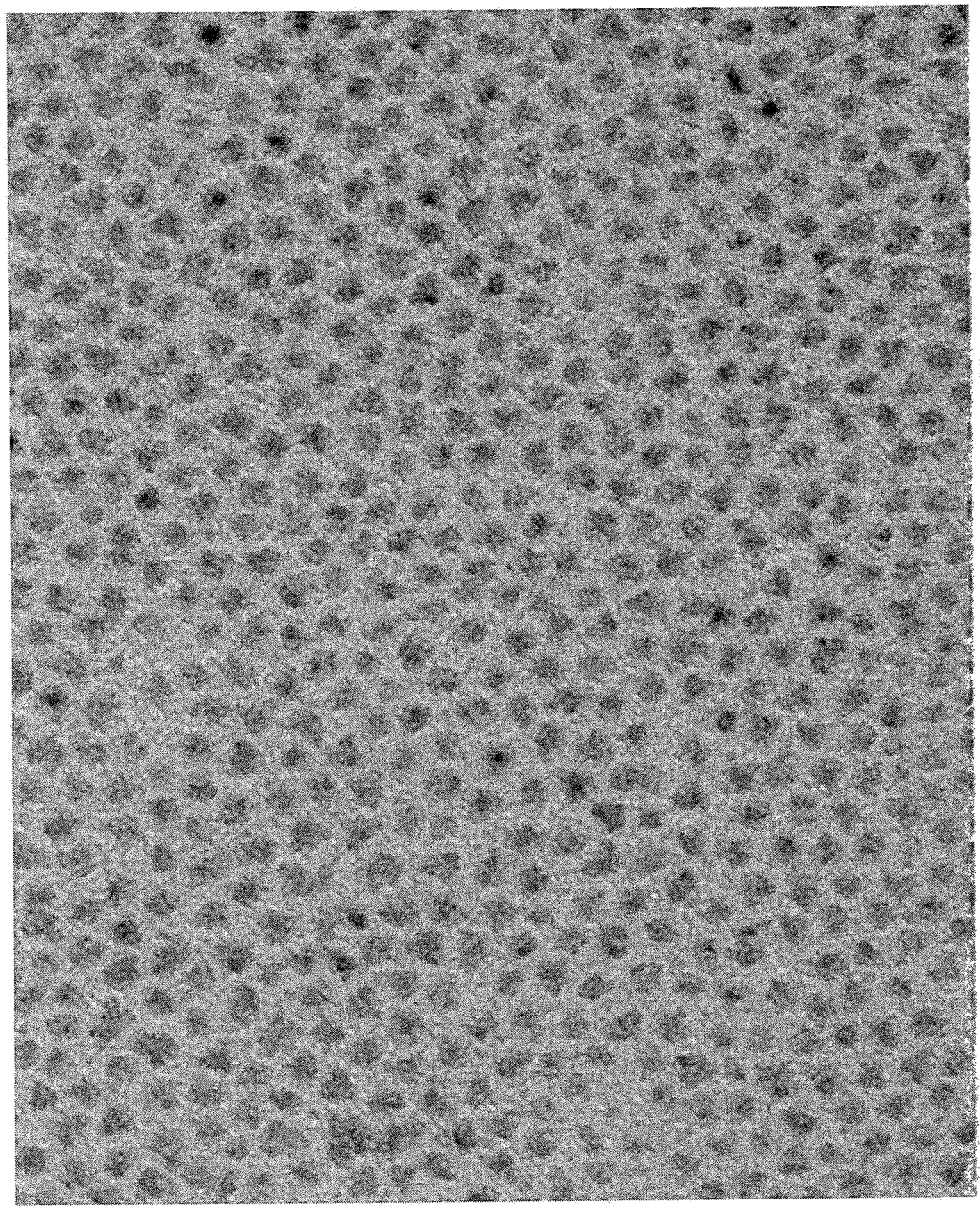
FIG. 7 is a TEM image of ZnTe/ZnSe core/shell nanostructures prepared using the method of Example 8. The nanostructures showed a peak emission wavelength of 523 nm.
Figure 8:
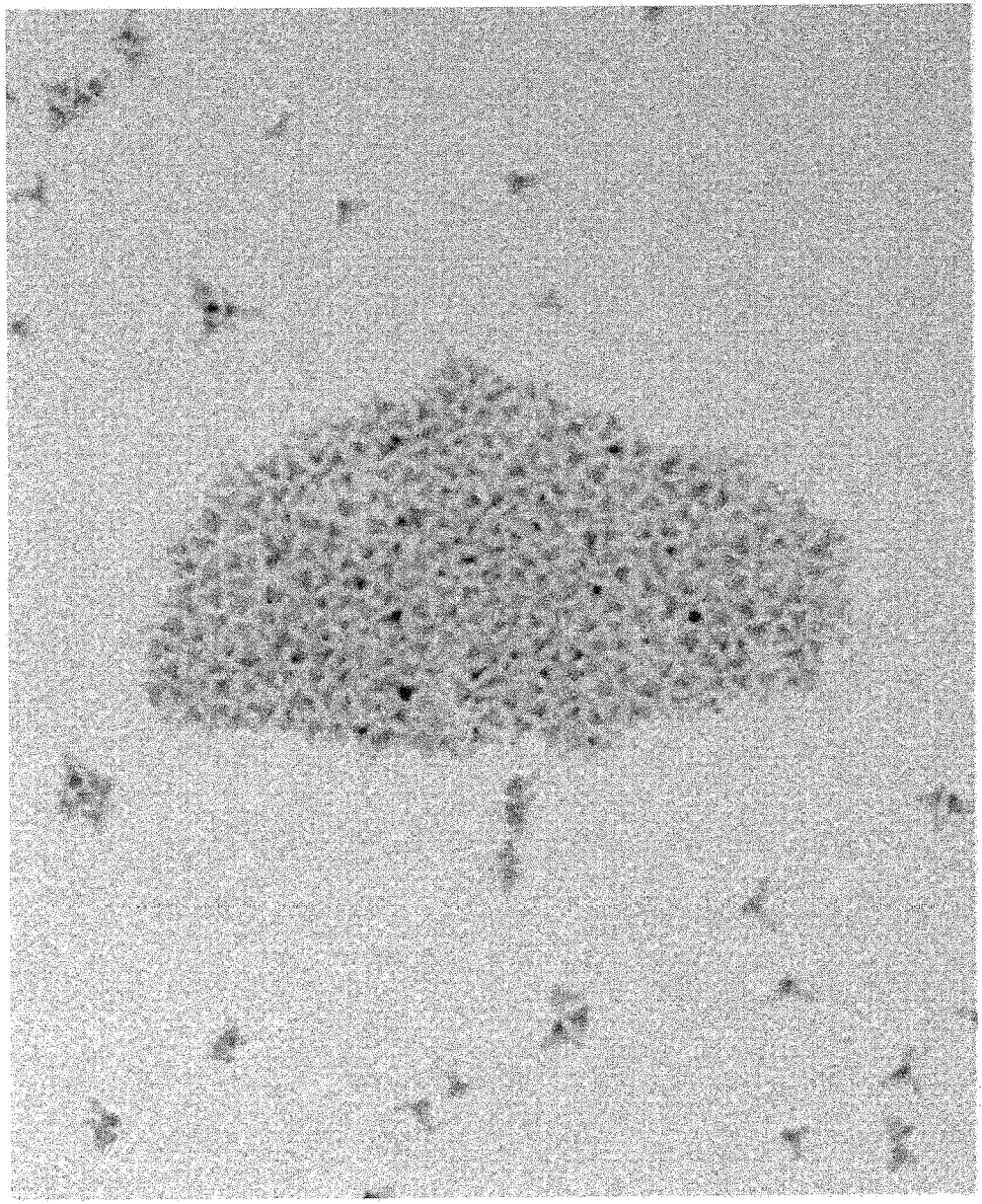
FIG. 8 is a TEM image of ZnTe/ZnSe/ZnS core/shell/shell nanostructures prepared using the method of Example 11.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value, or +/−5% of the value, or +/−1% of the value so described. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, nanotripods, nanobipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

"Peak emission wavelength" (PWL) is the wavelength where the radiometric emission spectrum of the light source reaches its maximum.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "monolayer" is a measurement unit of shell thickness derived from the bulk crystal structure of the shell material as the closest distance between relevant lattice planes. By way of example, for cubic lattice structures the thickness of one monolayer is determined as the distance between adjacent lattice planes in the [111] direction. By way of example, one monolayer of cubic ZnSe corresponds to 0.328 nm and one monolayer of cubic ZnS corresponds to 0.31 nm thickness. The thickness of a monolayer of alloyed materials can be determined from the alloy composition through Vegard's law.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

As used herein, the term "photoconversion efficiency" (PCE) is a measure of the ratio of green photons emitted (forward cast) versus the total incident blue photons.

Unless clearly indicated otherwise, ranges listed herein are inclusive.

A variety of additional terms are defined or otherwise characterized herein.

Nanostructure

In some embodiments, the present disclosure provides a nanostructure comprising a core surrounded by at least one shell, wherein the core comprises ZnTe and wherein the nanostructure exhibits an optical density at 450 nm on a per mass basis of between about 0.4 $cm^2$/mg and about 1.0 $cm^2$/mg.

In some embodiments, the present disclosure provides a nanostructure comprising a core and at least two shells, wherein the core comprises ZnTe and wherein the nanostructure exhibits an optical density at 450 nm on a per mass basis of between about 0.4 $cm^2$/mg and about 1.0 $cm^2$/mg.

In some embodiments, the present disclosure provides a nanostructure comprising a core and at least two shells, wherein the core comprises ZnTe, one shell comprises ZnSe, one shell comprises ZnS, and wherein the nanostructure exhibits an optical density at 450 nm on a per mass basis of between about 0.4 $cm^2$/mg and about 1.0 $cm^2$/mg.

In some embodiments, the nanostructure is a quantum dot.

Nanostructure Composition

In some embodiments, the present disclosure provides a nanostructure composition comprising:
 (a) at least one population of nanostructures, the nanostructures comprising a core surrounded by at least one shell, wherein the core comprises ZnTe and wherein the nanostructure exhibits an optical density at 450 nm on a per mass basis of between about 0.4 $cm^2$/mg and about 1.0 $cm^2$/mg; and
 (b) at least one organic resin.

In some embodiments, the present disclosure provides a nanostructure composition comprising:
 (a) at least one population of nanostructures, the nanostructures comprising a core and at least two shells, wherein the core comprises ZnTe and wherein the nanostructure exhibits an optical density at 450 nm on a per mass basis of between about 0.4 cm²/mg and about 1.0 cm²/mg; and (b) at least one organic resin.

In some embodiments, the nanostructure is a quantum dot.

Nanostructure Film Layer

In some embodiments, the present disclosure provides a nanostructure film layer comprising:

(a) at least one population of nanostructures, the nanostructures comprising a core surrounded by at least one shell, wherein the core comprises ZnTe and wherein the nanostructure exhibits an optical density at 450 nm on a per mass basis of between about 0.4 cm²/mg and about 1.0 cm²/mg; and (b) at least one organic resin;

wherein the nanostructure film layer exhibits a photoconversion efficiency of between about 25% and about 40%.

In some embodiments, the present disclosure provides a nanostructure film layer comprising:

(a) at least one population of nanostructures, the nanostructures comprising a core surrounded by at least two shells, wherein the core comprises ZnTe and wherein the nanostructure exhibits an optical density at 450 nm on a per mass basis of between about 0.4 cm²/mg and about 1.0 cm²/mg; and (b) at least one organic resin;

wherein the nanostructure film layer exhibits a photoconversion efficiency of between about 25% and about 40%.

In some embodiments, the nanostructure is a quantum dot.

In some embodiments, the nanostructure film layer is a color conversion layer.

Nanostructure Molded Article

In some embodiments, the present disclosure provides a nanostructure molded article comprising:

(a) a first barrier layer;

(b) a second barrier layer; and (c) a nanostructure layer between the first barrier layer and the second barrier layer, wherein the nanostructure layer comprises a population of nanostructures comprising at least one population of nanostructures, the nanostructures comprising a core surrounded by at least one shell, wherein the core comprises ZnTe and wherein the nanostructure exhibits an optical density at 450 nm on a per mass basis of between about 0.4 cm²/mg and about 1.0 cm²/mg; and at least one organic resin.

In some embodiments, the nanostructure layer in the molded article exhibits a photoconversion efficiency of between about 25% and about 40%.

In some embodiments, the present disclosure provides a nanostructure molded article comprising:

(a) a first barrier layer;

(b) a second barrier layer; and (c) a nanostructure layer between the first barrier layer and the second barrier layer, wherein the nanostructure layer comprises a population of nanostructures comprising at least one population of nanostructures, the nanostructures comprising a core surrounded by at least two shells, wherein the core comprises ZnTe and wherein the nanostructure exhibits an optical density at 450 nm on a per mass basis of between about 0.4 cm²/mg and about 1.0 cm²/mg; and at least one organic resin.

In some embodiments, the nanostructure layer in the molded article exhibits a photoconversion efficiency of between about 25% and about 40%.

In some embodiments, the nanostructure is a quantum dot. In some embodiments, the molded article is a film or substrate for a display. In some embodiments, the molded article is a liquid crystal display. In some embodiments, the molded article is a nanostructure film.

Production of Nanostructures

Methods for colloidal synthesis of a variety of nanostructures are known in the art. Such methods include techniques for controlling nanostructure growth, e.g., to control the size and/or shape distribution of the resulting nanostructures.

In a typical colloidal synthesis, semiconductor nanostructures are produced by rapidly injecting precursors that undergo pyrolysis into a hot solution (e.g., hot solvent and/or surfactant). The precursors can be injected simultaneously or sequentially. The precursors rapidly react to form nuclei. Nanostructure growth occurs through monomer addition to the nuclei.

Surfactant molecules interact with the surface of the nanostructure. At the growth temperature, the surfactant molecules rapidly adsorb and desorb from the nanostructure surface, permitting the addition and/or removal of atoms from the nanostructure while suppressing aggregation of the growing nanostructures. In general, a surfactant that coordinates weakly to the nanostructure surface permits rapid growth of the nanostructure, while a surfactant that binds more strongly to the nanostructure surface results in slower nanostructure growth. The surfactant can also interact with one (or more) of the precursors to slow nanostructure growth.

A number of parameters are thus known to affect nanostructure growth and can be manipulated, independently or in combination, to control the size and/or shape distribution of the resulting nanostructures. These include, e.g., temperature (nucleation and/or growth), precursor composition, time-dependent precursor concentration, ratio of the precursors to each other, surfactant composition, number of surfactants, and ratio of surfactant(s) to each other and/or to the precursors.

Synthesis of Group II-VI nanostructures has been described, e.g., in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and U.S. Patent Appl. Publication Nos. 2011/0262752 and 2011/0263062.

Although Group II-VI nanostructures such as CdSe/CdS/ZnS core/shell quantum dots can exhibit desirable luminescence behavior, as noted above, issues such as the toxicity of cadmium limit the applications for which such nanostructures can be used. Less toxic alternatives with favorable luminescence properties are thus highly desirable.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, is measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

Production of the ZnTe Core

In some embodiments, the nanostructure comprises a ZnTe core. In some embodiments, the nanostructure comprises a ZnTe core and a ZnSe shell. In some embodiments, the nanostructure comprises a ZnTe core, a ZnSe shell, and a ZnS shell. In some embodiments, the nanostructure is a ZnTe/ZnSe/ZnS core/shell(s) nanostructure.

As used herein, the term "nucleation phase" refers to the formation of a ZnTe core nucleus. As used herein, the term "growth phase" refers to the growth process of adding additional inorganic material to a nanostructure.

The diameter of a ZnTe nanocrystal core can be controlled by varying the amount of precursors provided. The diameter of a ZnTe nanocrystal can be determined using techniques known to those of skill in the art. In some embodiments, the diameter of a ZnTe nanocrystal core is determined using transmission electron microscopy (TEM).

In some embodiments, a ZnTe nanocrystal core has a diameter of between about 1.0 nm and about 7.0 nm, about 1.0 nm and about 6.0 nm, about 1.0 nm and about 5.0 nm, about 1.0 nm and about 4.0 nm, about 1.0 nm and about 3.0 nm, about 1.0 nm and about 2.0 nm, about 2.0 nm and about 7.0 nm, about 2.0 nm and about 6.0 nm, about 2.0 nm and about 5.0 nm, about 2.0 nm and about 4.0 nm, about 2.0 nm and about 3.0 nm, about 3.0 nm and about 7.0 nm, about 3.0 nm and about 6.0 nm, about 3.0 nm and about 5.0 nm, about 3.0 nm and about 4.0 nm, about 4.0 nm and about 7.0 nm, about 4.0 nm and about 6.0 nm, about 4.0 nm and about 5.0 nm, about 5.0 nm and about 7.0 nm, about 5.0 nm and about 6.0 nm, or about 6.0 nm and about 7.0 nm. In some embodiments, a ZnTe nanocrystal core has a diameter of between about 3.0 nm and about 6.0 nm.

In some embodiments, a ZnTe nanocrystal core is doped with at least one metal ion or other element. Doping is the intentional introduction of an impurity into a nanostructure for the purpose of altering its optical, electrical, chemical, and/or magnetic properties. Yim, K., et al., *Scientific Reports* 7:40907 (January 2017). In doping, very small quantities of a metal ion are used resulting in only minor distortions of the lattice of the nanostructure. In some embodiments, the concentration of dopant is between about $10^{15}$ atoms/cm$^3$ and about $10^{20}$ atoms/cm$^3$.

In some embodiments, a ZnTe nanocrystal core is doped with at least one metal ion or other element selected from the group consisting of lithium, boron, carbon, nitrogen, fluorine, sodium, aluminum, silicon, chlorine, potassium, scandium, selenium, titanium, vanadium, chromium, manganese, nickel, gallium, arsenic, palladium, gold, cadmium, indium, tin, antimony, lead, and combinations thereof. In some embodiments, a ZnTe nanocrystal core is doped with at least one metal ion or other element selected from the group consisting of indium, gallium, aluminum, selenium, titanium, tin, chlorine, fluorine, and combinations thereof.

In some embodiments, a ZnTe nanocrystal core is alloyed with at least one metal ion or other element. An alloy is a combination of at least two metals or a combination of at least one metal ion and at least one other element. In forming an alloy, large concentrations of a metal ion or other element are used resulting in properties that are often different from the pure material. In some embodiments, the concentration of metal ion or other element alloyed with ZnTe is between about 0.1 wt % and about 50 wt %.

In some embodiments, a ZnTe nanocrystal core is alloyed with at least one metal or other element selected from the group consisting of magnesium, cadmium, mercury, sulfur, and selenium. In some embodiments, a ZnTe nanocrystal core is alloyed with selenium.

In some embodiments, the present invention provides a method of producing a ZnTe nanocrystal comprising:
(a) admixing a zinc source and at least one solvent to produce a reaction mixture; and
(b) contacting the reaction mixture obtained in (a) with a solution comprising a reducing agent and a tellurium source;
to provide a ZnTe nanocrystal.

In some embodiments, the present invention provides a method of producing a ZnTe nanocrystal comprising:
(a) admixing a zinc source and at least one solvent to produce a reaction mixture;
(b) contacting the reaction mixture obtained in (a) with a solution comprising a reducing agent and a tellurium source;
(c) contacting the reaction mixture obtained in (b) with at least one ligand;
to provide a ZnTe nanocrystal.

In some embodiments, the zinc source is a zinc carboxylate. In some embodiments, the zinc source is a commercially available zinc carboxylate. In some embodiments, the zinc source is a zinc carboxylate produced by reacting a zinc salt and a carboxylic acid.

In some embodiments, the zinc salt is selected from zinc acetate, zinc fluoride, zinc chloride, zinc bromide, zinc iodide, zinc nitrate, zinc triflate, zinc tosylate, zinc mesylate, zinc oxide, zinc sulfate, zinc acetylacetonate, zinc toluene-3,4-dithiolate, zinc p-toluenesulfonate, zinc diethyldithiocarbamate, zinc dibenzyldithiocarbamate, and mixtures thereof.

In some embodiments, the carboxylic acid is selected from acetic acid, propionic acid, butyric acid, valeric acid, caproic acid, heptanoic acid, caprylic acid, capric acid, undecanoic acid, lauric acid, myristic acid, palmitic acid, stearic acid, behenic acid, acrylic acid, methacrylic acid, but-2-enoic acid, but-3-enoic acid, pent-2-enoic acid, pent-4-enoic acid, hex-2-enoic acid, hex-3-enoic acid, hex-4-enoic acid, hex-5-enoic acid, hept-6-enoic acid, oct-2-enoic acid, dec-2-enoic acid, undec-10-enoic acid, dodec-5-enoic acid, oleic acid, gadoleic acid, erucic acid, linoleic acid, α-linolenic acid, calendic acid, eicosadienoic acid, eicosatrienoic acid, arachidonic acid, stearidonic acid, benzoic acid, para-toluic acid, ortho-toluic acid, meta-toluic acid, hydrocinnamic acid naphthenic acid cinnamic acid, para-toluenesulfonic acid, and mixtures thereof.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the admixture in (a) further comprises a zinc compound. In some embodiments, the zinc compound quenches moisture in the admixture.

In some embodiments, the zinc compound is a dialkyl zinc compound. In some embodiments, the zinc compound is diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, or zinc sulfate. In some embodiments, the zinc compound is diethylzinc or dimethylzinc. In some embodiments, the zinc compound is diethylzinc.

In some embodiments, the admixture in (a) comprises a solvent.

In some embodiments, the solvent in (a) is toluene, benzene, dibenzyl ether, dioctylether, trioctylamine, trioctylphosphine, trioctylphosphine oxide, squalene, octadecene, dimethylformamide, or N-methylpyrrolidinone. In some embodiments, the solvent is dibenzyl ether. In some embodiments, the solvent is octadecene.

In some embodiments, the admixture in (a) further comprises at least one ligand. In some embodiments, a ZnTe nanocrystal core is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligand are disclosed in U.S. Patent Application Publication Nos. 2005/0205849, 2008/0105855, 2008/0118755, 2009/0065764, 2010/0140551, 2013/0345458, 2014/0151600, 2014/0264189, and 2014/0001405.

In some embodiments, ligands suitable for the synthesis of nanostructure cores, including ZnTe cores, are known by those of skill in the art. In some embodiments, the ligand in (a) is a fatty acid selected from lauric acid, caproic acid, myristic acid, palmitic acid, stearic acid, and oleic acid. In some embodiments, the at least one ligand in (a) is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the at least one ligand in (a) is an amine selected from dodecylamine, oleylamine, hexadecylamine, and octadecylamine. In some embodiments, the at least one ligand in (a) is lauric acid.

In some embodiments, a ZnTe nanocrystal is produced in the presence of a mixture of ligands. In some embodiments, a ZnTe nanocrystal is produced in the presence of a mixture comprising 2, 3, 4, 5, or 6 different ligands. In some embodiments, a ZnTe nanocrystal is produced in the presence of a mixture comprising 3 different ligands.

In some embodiments, the reducing agent in (b) is selected from the group consisting of diborane, sodium hydride, sodium borohydride, lithium borohydride, sodium cyanoborohydride, calcium hydride, lithium hydride, lithium aluminum hydride, diisobutylaluminum hydride, sodium triethylborohydride, and lithium triethylborohydride.

In some embodiments, the reducing agent in (b) is lithium triethylborohydride.

In some embodiments, the tellurium source in (b) is selected from trioctylphosphine telluride, tri(n-butyl)phosphine telluride, trimethylphosphine telluride, triphenylphosphine telluride, tricyclohexylphosphine telluride, elemental tellurium, hydrogen telluride, bis(trimethylsilyl) telluride, and mixtures thereof. In some embodiments, the tellurium source is trioctylphosphine telluride (TOPTe).

In some embodiments, a solution in (b) comprising a tellurium source and a reducing agent is prepared separately. In some embodiments, a solution in (b) comprising a tellurium source and a reducing agent is prepared in situ.

In some embodiments, the mole ratio of zinc source to tellurium source is between about 0.25:1 and about 2.5:1, about 0.25:1 and about 2:1, about 0.25:1 and about 1.5:1, about 0.25:1 and about 1:1, about 0.25:1 and about 0.75:1, about 0.25:1 and about 0.5:1, about 0.5:1 and about 2.5:1, about 0.5:1 and about 2:1, about 0.5:1 and about 1.5:1, about 0.5:1 and about 1:1, about 0.5:1 and about 0.75:1, about 0.75:1 and about 2.5:1, about 0.75:1 and about 2:1, about 0.75:1 and about 1.5:1, about 0.75:1 and about 1:1, about 1:1 and about 2.5:1, about 1.1 and about 2:1, about 1:1 and about 1.5:1, about 1.5:1 and about 2.5:1, about 1.5:1 and about 2:1, or about 2:1 and about 2.5:1.

In some embodiments, the present invention provides a method of producing a ZnTe nanocrystal core comprising:
(a) admixing a zinc source and at least one ligand to produce a reaction mixture;
(b) contacting the reaction mixture obtained in (a) with a solution comprising a reducing agent and a tellurium source;
(c) contacting the reaction mixture obtained in (b) with at least one ligand;
to provide a ZnTe nanocrystal.

In some embodiments, the at least one ligand in (c) is a fatty acid selected from lauric acid, caproic acid, myristic acid, palmitic acid, stearic acid, and oleic acid. In some embodiments, the at least one ligand in (c) is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the at least one ligand in (c) is an amine selected from dodecylamine, oleylamine, hexadecylamine, and octadecylamine. In some embodiments, the at least one ligand in (c) is oleylamine. In some embodiments, the at least one ligand in (c) is trioctylphosphine. In some embodiments, the at least one ligand in (c) is a mixture of oleylamine and trioctylphosphine.

In some embodiments, a zinc source and at least one solvent are admixed in (a) at a reaction temperature between 0° C. and 200° C., 0° C. and 150° C., 0° C. and 100° C. 0° C. and 50° C., 0° C. and 25° C., 0° C. and 20° C., 20° C. and 200° C., 20° C. and 150° C., 20° C. and 100° C., 20° C. and 50° C., 20° C. and 25° C., 25° C. and 200° C., 25° C. and 150° C., 25° C. and 100° C., 25° C. and 50° C., 50° C. and 200° C., 50° C. and 150° C., 50° C. and 100° C., 100° C. and 200° C., 100° C. and 150° C., or 150° C. and 200° C. In some embodiments, a zinc source and at least one ligand are admixed at a reaction temperature of between about 50° C. and about 150° C.

In some embodiments, the reaction mixture after admixing a zinc source and at least one solvent in (a) is maintained at a temperature for between 2 and 60 minutes, 2 and 45 minutes, 2 and 30 minutes, 2 and 15 minutes, 2 and 5 minutes, 5 and 60 minutes, 5 and 45 minutes, 5 and 30 minutes, 5 and 15 minutes, 15 and 60 minutes, 15 and 45 minutes, 15 and 30 minutes, 30 and 60 minutes, 30 and 45 minutes, or 45 and 60 minutes.

In some embodiments, the reaction mixture after admixing a zinc source and at least one solvent in (a) is elevated, maintained, or reduced to a temperature between 100° C. and 300° C., 100° C. and 250° C., 100° C. and 200° C., 100° C. and 150° C., 150° C. and 300° C., 150° C. and 250° C., 150° C. and 200° C., 200° C. and 300° C., 200° C. and 250° C., or 250° C. and 300° C. In some embodiments, a zinc source and at least one solvent are admixed in (a) at a reaction temperature of between about 200° C. and about 250° C.

In some embodiments, a solution comprising a reducing agent and a tellurium source is added to the reaction mixture of (a) at a reaction temperature between 100° C. and 300° C., 100° C. and 250° C., 100° C. and 200° C., 100° C. and 150° C., 150° C. and 300° C., 150° C. and 250° C., 150° C. and 200° C., 200° C. and 300° C., 200° C. and 250° C., or 250° C. and 300° C. In some embodiments, a tellurium source is added to the reaction mixture of (a) at a reaction temperature of between about 200° C. and about 250° C.

In some embodiments, the reaction mixture—after addition of a solution comprising a reducing agent and a tellurium source—is maintained at a temperature for between 2 and 60 minutes, 2 and 45 minutes, 2 and 30 minutes, 2 and 15 minutes, 2 and 5 minutes, 5 and 60 minutes, 5 and 45 minutes, 5 and 30 minutes, 5 and 15 minutes, 15 and 60 minutes, 15 and 45 minutes, 15 and 30 minutes, 30 and 60 minutes, 30 and 45 minutes, or 45 and 60 minutes.

In some embodiments, the reaction mixture—after addition of a solution comprising a reducing agent and a tellurium—is contacted with at least one ligand. In some embodiments, at least one ligand is contacted with the reaction mixture of (b) at a reaction temperature between 100° C. and 300° C., 100° C. and 250° C. 100° C. and 200° C., 100° C. and 150° C., 150° C. and 300° C., 150° C. and 250° C., 150° C. and 200° C., 200° C. and 300° C., 200° C. and 250° C., or 250° C. and 300° C. In some embodiments, at least one ligand is contacted with the reaction mixture of (b) at a reaction temperature of between about 200° C. and about 250° C.

In some embodiments, at least one ligand is contacted with the reaction mixture of (b) over a period of between 2 and 120 minutes, 2 and 60 minutes, 2 and 30 minutes, 2 and 20 minutes, 2 and 15 minutes, 2 and 10 minutes, 2 and 8 minutes, 2 and 5 minutes, 5 and 120 minutes, 5 and 60 minutes, 5 and 30 minutes, 5 and 20 minutes, 5 and 15 minutes, 5 and 10 minutes, 5 and 8 minutes, 8 and 120 minutes, 8 and 60 minutes, 8 and 30 minutes, 8 and 20 minutes, 8 and 15 minutes, 8 and 10 minutes, 10 and 120 minutes, 10 and 60 minutes, 10 and 30 minutes, 10 and 20 minutes, 10 and 15 minutes, 15 and 120 minutes, 15 and 60 minutes, 15 and 30 minutes, 15 and 20 minutes, 20 and 120 minutes, 20 and 60 minutes, 20 and 30 minutes, 30 and 120 minutes, 30 and 60 minutes, or 60 and 120 minutes.

In some embodiments, the reaction mixture—after addition of at least one ligand in (c)—is maintained at a temperature for between 2 and 60 minutes, 2 and 45 minutes, 2 and 30 minutes, 2 and 15 minutes, 2 and 5 minutes, 5 and 60 minutes, 5 and 45 minutes, 5 and 30 minutes, 5 and 15 minutes, 15 and 60 minutes, 15 and 45 minutes, 15 and 30 minutes, 30 and 60 minutes, 30 and 45 minutes, or 45 and 60 minutes.

After the ZnTe nanocrystal cores reach the desired size, they can be cooled. In some embodiments, the ZnTe nanocrystal cores are cooled to room temperature. In some embodiments, an organic solvent is added to dilute the reaction mixture comprising the ZnTe nanocrystal cores.

In some embodiments, the organic solvent is hexane, pentane, toluene, benzene, dichloromethane (methylene chloride), chloroform, dimethylformamide, or N-methylpyrrolidinone. In some embodiments, the organic solvent is toluene.

In some embodiments, the ZnTe nanocrystal cores are isolated. In some embodiments, the ZnTe nanocrystal cores are isolated by precipitation of the ZnTe nanocrystals from solvent. In some embodiments, the ZnTe nanocrystal cores are isolated by precipitation with ethanol.

Production of a Shell

In some embodiments, the nanostructures of the present invention include a ZnTe core and at least one shell. In some embodiments, the nanostructures of the present invention include a ZnTe core and at least two shells. The shell can, e.g., increase the quantum yield and/or stability of the nanostructures. In some embodiments, the core and the shell comprise different materials. In some embodiments, the nanostructure comprises shells of different shell material.

In some embodiments, a shell that comprises a mixture of Group II and VI elements is deposited onto a core or a core/shell(s) structure. In some embodiments, the shell deposited is a mixture of at least two of a zinc source, a selenium source, a sulfur source, a tellurium source, a magnesium source, and a cadmium source. In some embodiments, the shell deposited is a mixture of two of a zinc source, a selenium source, a sulfur source, a tellurium source, a magnesium source, and a cadmium source. In some embodiments, the shell deposited is a mixture of three of a zinc source, a selenium source, a sulfur source, a tellurium source, a magnesium source, and a cadmium source. In some embodiments, the shell comprises zinc and sulfur; zinc and selenium; zinc, sulfur, and selenium; zinc and tellurium; zinc and magnesium; zinc, sulfur, and magnesium; zinc, selenium, and magnesium; zinc, tellurium, and magnesium; zinc, cadmium, and magnesium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium, zinc, and sulfur; cadmium, zinc, and selenium; or cadmium, zinc, sulfur, and selenium.

In some embodiments, a shell comprises more than one monolayer of shell material. The number of monolayers is an average for all the nanostructures; therefore, the number of monolayers in a shell may be a fraction. In some embodiments, the number of monolayers in a shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the shell comprises between 3 and 5 monolayers.

The thickness of the shell can be controlled by varying the amount of precursor provided. For a given shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by TEM. In some embodiments, each shell has a thickness of between 0.05 nm and 3.5 nm, 0.05 nm and 2 nm, 0.05 nm and 0.9 nm, 0.05 nm and 0.7 nm, 0.05 nm and 0.5 nm, 0.05 nm and 0.3 nm, 0.05 nm and 0.1 nm, 0.1 nm and 3.5 nm, 0.1 nm and 2 nm, 0.1 nm and 0.9 nm, 0.1 nm and 0.7 nm, 0.1 nm and 0.5 nm, 0.1 nm and 0.3 nm 0.3 nm and 3.5 nm 0.3 nm and 2 nm, 0.3 nm and 0.9 nm, 0.3 nm and 0.7 nm, 0.3 nm and 0.5 nm, 0.5 nm and 3.5 nm, 0.5 nm and 2 nm 0.5 nm and 0.9 nm 0.5 nm and 0.7 nm, 0.7 nm and 3.5 nm, 0.7 nm and 2 nm, 0.7 nm and 0.9 nm, 0.9 nm and 3.5 nm, 0.9 nm and 2 nm, or 2 nm and 3.5 nm.

In some embodiments, each shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Appl. Publication No. 2008/0118755.

Ligands suitable for the synthesis of a shell are known by those of skill in the art. In some embodiments, the ligand is a fatty acid selected from the group consisting of lauric acid, caproic acid, caprylic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is trioctylphosphine, oleic acid, lauric acid, or a combination thereof.

In some embodiments, each shell is produced in the presence of a mixture of ligands. In some embodiments, each shell is produced in the presence of a mixture comprising 2, 3, 4, 5, or 6 different ligands. In some embodiments, each shell is produced in the presence of a mixture comprising 3 different ligands. In some embodiments, the mixture of ligands comprises tributylphosphine, oleic acid, and oleylamine.

In some embodiments, each shell is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, and dioctyl ether.

In some embodiments, a core or a core/shell(s) and shell precursor are admixed at a temperature between 20° C. and 310° C., 20° C. and 280° C., 20° C. and 250° C., 20° C. and 200° C., 20° C. and 150° C., 20° C. and 100° C. 20° C. and 50° C., 50° C. and 310° C., 50° C. and 280° C., 50° C. and 250° C., 50° C. and 200° C., 50° C. and 150° C., 50° C. and 100° C., 100° C. and 310° C., 100° C. and 280° C., 100° C. and 250° C., 100° C. and 200° C., 100° C. and 150° C., 150° C. and 310° C., 150° C. and 280° C., 150° C. and 250° C., 150° C. and 200° C., 200° C. and 310° C., 200° C. and 280° C., 200° C. and 250° C., 250° C. and 310° C., 250° C. and 280° C. or 280° C. and 310° C. In some embodiments, a core or a core/shell(s) and shell precursor are admixed at a temperature between 20° C. and 150° C.

In some embodiments, after admixing a core or core/shell(s) and shell precursor, the temperature of the reaction mixture is increased, maintained, or reduced to a temperature between 200° C. and 310° C., 200° C. and 280° C., 200° C. and 250° C., 200° C. and 220° C., 220° C. and 310° C., 220° C. and 280° C., 220° C. and 250° C., 250° C. and 310° C., 250° C. and 280° C. or 280° C. and 310° C. In some embodiments, after contacting a core or core/shell(s) and shell precursor, the temperature of the reaction mixture is increased, maintained, or reduced to between 200° C. and 310° C.

In some embodiments, after admixing a core or core/shell(s) and shell precursor, the time to reach the temperature is between 2 and 240 minutes, between 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes.

In some embodiments, after admixing a core or core/shell(s) and shell precursor, the temperature of the reaction mixture is maintained for between 2 and 240 minutes, 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes. In some embodiments, after admixing a core or core/shell(s) and shell precursor, the temperature of the reaction mixture is maintained for between 30 and 120 minutes.

In some embodiments, additional shells are produced by further additions of shell material precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell material precursor to provide further shells. In some embodiments, the nanostructure is maintained at an elevated temperature before the addition of shell material precursor to provide further shells.

After sufficient layers of shell have been added for the nanostructure to reach the desired thickness and diameter, the nanostructure can be cooled. In some embodiments, the core/shell(s) nanostructures are cooled to room temperature. In some embodiments, an organic solvent is added to dilute the reaction mixture comprising the core/shell(s) nanostructures.

In some embodiments, the organic solvent used to dilute the reaction mixture is ethanol, hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene. In some embodiments, the organic solvent is a combination of toluene and ethanol.

In some embodiments, core/shell(s) nanostructures are isolated. In some embodiments, the coreshell(s) nanostructures are isolated by precipitation using an organic solvent. In some embodiments, the core/shell(s) nanostructures are isolated by flocculation with ethanol.

The number of monolayers will determine the size of the coreshell(s) nanostructures. The size of the core/shell(s) nanostructures can be determined using techniques known to those of skill in the art. In some embodiments, the size of the core/shell(s) nanostructures is determined using TEM. In some embodiments, the core/shell(s) nanostructures have an average diameter of between 1 nm and 15 nm, 1 nm and 10 nm, 1 nm and 9 nm, 1 nm and 8 nm, 1 nm and 7 nm, 1 nm and 6 nm, 1 nm and 5 nm, 5 nm and 15 nm, 5 nm and 10 nm, 5 nm and 9 nm, 5 nm and 8 nm, 5 nm and 7 nm, 5 nm and 6 nm, 6 nm and 15 nm, 6 nm and 10 nm, 6 nm and 9 nm, 6 nm and 8 nm, 6 nm and 7 nm 7 nm and 15 nm 7 nm and 10 nm, 7 nm and 9 nm, 7 nm and 8 nm, 8 nm and 15 nm, 8 nm and 10 nm, 8 nm and 9 nm, 9 nm and 15 nm, 9 nm and 10 nm, or 10 nm and 15 nm. In some embodiments, the core/shell(s) nanostructures have an average diameter of between 5 nm and 6 nm.

In some embodiments, the core/shell(s) nanostructure is subjected to an acid etching step before deposition of an additional shell.

Production of a ZnSe Shell

In some embodiments, the shell deposited onto the core or core/shell(s) nanostructure is a ZnSe shell.

In some embodiments, the shell precursors contacted with a core or core/shell(s) nanostructure to prepare a ZnSe shell comprise a zinc source and a selenium source.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, the molar ratio of core to zinc source to prepare a ZnSe shell is between 1:200 and 1:9000, 1:200 and 1:5000, 1:200 and 1:1000, 1:200 and 1:500, 1:200 and 1:250, 1:500 and 1:9000, 1:500 and 1:5000, 1:500 and 1:1000, 1:1000 and 1:9000, 1:1000 and 1:5000, or 1:500 and 1:9000. In some embodiments, the molar ratio of core to zinc source to prepare a ZnSe shell is between 1:200 and 1:9000. In some embodiments, the molar ratio of core to selenium source to prepare a ZnSe shell is between 1:200 and 1:9000, 1:200 and 1:5000, 1:200 and 1:1000, 1:200 and 1:500, 1:200 and 1:250, 1:500 and 1:9000, 1:500 and 1:5000, 1:500 and 1:1000, 1:1000 and 1:9000, 1:1000 and 1:5000, or 1:500 and 1:9000. In some embodiments, the molar ratio of core to selenium source to prepare a ZnSe shell is between 1:200 and 1:9000.

In some embodiments, the number of monolayers in a ZnSe shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the ZnSe shell comprises between 2 and 6 monolayers. In some embodiments, the ZnSe shell comprises between 3 and 5 monolayers. In some embodiments, the ZnSe shell comprises 2 to 4 monolayers.

In some embodiments, a ZnSe monolayer has a thickness of about 0.33 nm.

In some embodiments, a ZnSe shell has a thickness of between 0.5 nm and 4 nm, 0.5 nm and 3.5 nm, 0.5 nm and 3 nm, 0.5 nm and 2.5 nm, 0.5 nm and 2 nm, 0.5 nm and 1.5 nm, 1.5 nm and 4 nm, 1.5 nm and 3.5 nm, 1.5 nm and 3 nm, 1.5 nm and 2.5 nm, 1.5 nm and 1 nm, 1 nm and 4 nm, 1 nm and 3.5 nm, 1 nm and 3 nm, 1 nm and 2.5 nm, 1 nm and 2 nm, 1 nm and 1.5 nm, 1.5 nm and 4 nm, 1.5 nm and 3.5 nm, 1.5 nm and 3 nm, 1.5 nm and 2.5, 1.5 nm and 2 nm, 2 nm and 4 nm, 2 nm and 3.5 nm, 2 nm and 3 nm, 2 nm and 2.5 nm, 2.5 nm and 4 nm, 2.5 nm and 3.5 nm, 2.5 nm and 3 nm, 3 nm and 4 nm, 3 nm and 3.5 nm, or 3.5 nm and 4 nm. In some embodiments, a ZnSe shell has a thickness of between 0.6 nm and 1.5 nm.

Production of a ZnS Shell

In some embodiments, the shell deposited onto the core or core/shell(s) nanostructure is a ZnS shell.

In some embodiments, the shell precursors contacted with a core or core/shell(s) nanostructure to prepare a ZnS shell comprise a zinc source and a sulfur source.

In some embodiments, the ZnS shell passivates the particle surface, which leads to an improvement in the environmental stability and the quantum yield and to higher efficiencies when used in devices such as LEDs and lasers. Furthermore, spectral impurities which are caused by defect states may be eliminated by passivation, which increases the color saturation.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the sulfur source is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is an alkyl-substituted zinc dithiocarbamate. In some embodiments, the sulfur source is octanethiol. In some embodiments, the sulfur source is tributylphosphine sulfide.

In some embodiments, the molar ratio of core to zinc source to prepare a ZnS shell is between 1:200 and 1:9000, 1:200 and 1:5000, 1:200 and 1:1000, 1:200 and 1:500, 1:200 and 1:250, 1:500 and 1:9000, 1:500 and 1:5000, 1:500 and 1:1000, 1:1000 and 1:9000, 1:1000 and 1:5000, or 1:500 and 1:9000. In some embodiments, the molar ratio of core to zinc source to prepare a ZnS shell is between 1:200 and 1:9000.

In some embodiments, the molar ratio of core to sulfur source to prepare a ZnS shell is between 1:200 and 1:9000, 1:200 and 1:5000, 1:200 and 1:1000, 1:200 and 1:500, 1:200 and 1:250, 1:500 and 1:9000, 1:500 and 1:5000, 1:500 and 1:1000, 1:1000 and 1:9000, 1:1000 and 1:5000, or 1:500 and 1:9000. In some embodiments, the molar ratio of core to sulfur source to prepare a ZnS shell is between 1:200 and 1:9000.

In some embodiments, the number of monolayers in a ZnS shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the ZnS shell comprises between 2 and 12 monolayers. In some embodiments, the ZnS shell comprises between 4 and 6 monolayers. In some embodiments, the ZnS shell comprises between 1 and 3 monolayers.

In some embodiments, a ZnS monolayer has a thickness of about 0.31 nm.

In some embodiments, a ZnS shell has a thickness of between 0.3 nm and 4 nm, 0.3 nm and 3.5 nm, 0.3 nm and 3 nm, 0.3 nm and 2.5 nm, 0.3 nm and 2 nm, 0.3 nm and 1.5 nm, 1.5 nm and 4 nm, 1.5 nm and 3.5 nm, 1.5 nm and 3 nm, 1.5 nm and 2.5 nm, 1.5 nm and 1 nm, 1 nm and 4 nm, 1 nm and 3.5 nm, 1 nm and 3 nm, 1 nm and 2.5 nm, 1 nm and 2 nm, 1 nm and 1.5 nm, 1.5 nm and 4 nm, 1.5 nm and 3.5 nm, 1.5 nm and 3 nm, 1.5 nm and 2.5, 1.5 nm and 2 nm, 2 nm and 4 nm, 2 nm and 3.5 nm, 2 nm and 3 nm, 2 nm and 2.5 nm, 2.5 nm and 4 nm 2.5 nm and 3.5 nm 2.5 nm and 3 nm, 3 nm and 4 nm, 3 nm and 3.5 nm, or 3.5 nm and 4 nm. In some embodiments, a ZnS shell has a thickness of between 0.3 nm and 1 nm.

Core/Shell(s) Nanostructure Properties

In some embodiments, the core/shell(s) nanostructure is a ZnTe/ZnSe/ZnS core/shell nanostructure. In some embodiments, the core/shell(s) nanostructure is a ZnTe/ZnSe/ZnS core/shell quantum dot.

In some embodiments, the core/shell(s) nanostructures display a high photoluminescence quantum yield. In some embodiments, the core/shell(s) nanostructures display a photoluminescence quantum yield of between 20% and 99%, 20% and 95%, 20% and 90%, 20% and 85%, 20% and 80%, 20% and 60%, 20% and 50%, 20% and 40%, 40% and 99%, 40% and 95%, 40% and 90%, 40% and 85%, 40% and 80%, 40% and 60, 6, 40% and 50%, 50% and 99%, 50% and 95%, 50% and 90%, 50% and 85%, 60% and 99%, 60% and 95%, 60% and 85%, 80% and 99%, 80% and 90%, 80% and 85%, 85% and 99%, or 85% and 95%. In some embodiments, the core/shell(s) nanostructures display a photoluminescence quantum yield of between 20% and 60%. In some embodiments, the core/shell(s) nanostructures display a photoluminescence quantum yield of between 20% and 50%.

In some embodiments, the photoluminescence spectrum for the core/shell(s) nanostructures have a emission maximum between 300 nm and 590 nm, 300 nm and 550 nm, 300 nm and 450 nm, 450 nm and 590 nm, 450 nm and 550 nm, or 550 nm and 590. In some embodiments, the photoluminescence spectrum for the core/shell(s) nanostructures has an emission maximum of between 450 nm and 590 nm. In some embodiments, the photoluminescence spectrum for the core/shell(s) nanostructures has an emission maximum of between 510 nm and 530 nm.

The size distribution of the core/shell(s) nanostructures can be relatively narrow. In some embodiments, the photoluminescence spectrum of the population or core/shell(s) nanostructures can have a full width at half maximum of between 10 nm and 60 nm, 10 nm and 40 nm, 10 nm and 30 nm, 10 nm and 20 nm, 20 nm and 60 nm, 20 nm and 40 nm, 20 nm and 30 nm, 30 nm and 60 nm, 30 nm and 40 nm, or 40 nm and 60 nm. In some embodiments, the photoluminescence spectrum of the population or core/shell(s) nanostructures can have a full width at half maximum of between 30 nm and 60 nm.

In some embodiments, the nanostructures emit light having a peak emission wavelength (PWL) between about 400 nm and about 650 nm, about 400 nm and about 600 nm, about 400 nm and about 550 nm, about 400 nm and about 500 nm, about 400 nm and about 450 nm, about 450 nm and about 650 nm, about 450 nm and about 600 nm, about 450 nm and about 550 nm, about 450 nm and about 500 nm, about 500 nm and about 650 nm, about 500 nm and about 600 nm, about 500 nm and about 550 nm, about 550 nm and about 650 nm, about 550 nm and about 600 nm, or about 600 nm and about 650 nm. In some embodiments, the nanostructures emit light having a PWL between about 500 nm and about 550 nm. In some embodiments, the nanostructures emit light having a PWL between about 510 nm and about 530 nm.

As a predictive value for blue light absorption efficiency, the optical density at 450 nm on a per mass basis ($OD_{450}$/mass) can be calculated by measuring the optical density of a nanostructure solution in a 1 cm path length cuvette and dividing by the dry mass per mL of the same solution after removing all volatiles under vacuum (<200 mTorr). In some embodiments, the nanostructures have an optical density at 450 nm on a per mass basis ($OD_{450}$/mass) of between about 0.4 $cm^2$/mg and about 1.5 $cm^2$ mg, about 0.4 $cm^2$/mg and about 1.0 $cm^2$/mg, about 0.4 $cm^2$/mg and about 0.6 $cm^2$/mg, about 0.4 $cm^2$/mg and about 0.5 $cm^2$/mg, about 0.5 $cm^2$/mg and about 1.5 $cm^2$/mg, about 0.5 $cm^2$/mg and about 1.0 $cm^2$/mg, about 0.5 $cm^2$/mg and about 0.6 $cm^2$/mg, about 0.6 $cm^2$/mg and about 1.5 $cm^2$/mg, about 0.6 $cm^2$/mg and about 1.0 $cm^2$/mg, or about 1.0 $cm^2$/mg and about 1.5 $cm^2$/mg. In some embodiments, the nanostructures have an optical density at 450 nm on a per mass basis ($OD_{450}$/mass) of between about 0.4 $cm^2$/mg and about 1 $cm^2$/mg. In some embodiments, the nanostructures have an optical density at 450 nm on a per mass basis ($OD_{450}$/mass) of between about 0.45 $cm^2$/mg and about 0.9 $cm^2$/mg.

The optical density at 450 nm on a per inorganic mass basis ($OD_{450}$/inorganic mass) can be calculated by measuring the optical density of a nanostructure solution in a 1 cm path length cuvette and dividing by the dry inorganic mass per mL of the same solution after removing all volatiles under vacuum (<200 mTorr). In some embodiments, the nanostructures have an optical density at 450 nm on a per inorganic mass basis ($OD_{450}$/inorganic mass) of between about 1.0 $cm^2$/mg and about 2.5 $cm^2$/mg, about 1.0 $cm^2$/mg and about 2.0 $cm^2$/mg, about 1.0 $cm^2$/mg and about 1.5 $cm^2$/mg, about 1.0 $cm^2$/mg and about 1.25 $cm^2$/mg, about 1.25 $cm^2$/mg and about 2.5 $cm^2$/mg, about 1.25 $cm^2$/mg and about 2.0 $cm^2$/mg, about 1.25 $cm^2$/mg and about 1.5 $cm^2$/mg, about 1.5 $cm^2$/mg and about 2.5 $cm^2$/mg, about 1.5 $cm^2$/mg and about 2.0 $cm^2$/mg, or about 2.0 $cm^2$/mg and about 2.5 $cm^2$/mg.

Nanostructure Compositions

In some embodiments, the present disclosure provides a nanostructure composition comprising:
  (a) at least one population of nanostructures, the nanostructures comprising a core surrounded by at least one shell, wherein the core comprises ZnTe and wherein the nanostructure exhibits an optical density at 450 nm on a per mass basis of between about 0.4 cm$^2$/mg and about 1.0 cm$^2$/mg; and
  (b) at least one organic resin.

In some embodiments, the population of nanostructures emits red, green, or blue light. In some embodiments, the respective portions of red, green, and blue light can be controlled to achieve a desired white point for the white light emitted by a display device incorporating a nanostructure film.

In some embodiments, the nanostructure composition comprises at least one population of nanostructure materials. In some embodiments, the nanostructure composition comprises a population of between 1 and 5, 1 and 4, 1 and 3, 1 and 2, 2 and 5, 2 and 4, 2 and 3, 3 and 5, 3 and 4, or 4 and 5 nanostructures. Any suitable ratio of the populations of nanostructures can be combined to create the desired nanostructure composition characteristics. In some embodiments, the nanostructure is a quantum dot.

The present disclosure provides a method of preparing a nanostructure composition, the method comprising:
  (a) providing at least one population of nanostructures, the nanostructures comprising a core surrounded by at least one shell, wherein the core comprises ZnTe and wherein the nanostructure exhibits an optical density at 450 nm on a per mass basis of between about 0.4 cm$^2$/mg and about 1.0 cm$^2$/mg; and
  (b) admixing at least one organic resin with the composition of (a).

In some embodiments, the at least one population of nanostructures is admixed with at least one organic resin at an agitation rate of between about 100 rpm and about 10,000 rpm, about 100 rpm and about 5,000 rpm, about 100 rpm and about 3,000 rpm, about 100 rpm and about 1,000 rpm, about 100 rpm and about 500 rpm, about 500 rpm and about 10,000 rpm, about 500 rpm and about 5,000 rpm, about 500 rpm and about 3,000 rpm, about 500 rpm and about 1,000 rpm, about 1,000 rpm and about 10,000 rpm, about 1,000 rpm and about 5,000 rpm, about 1,000 rpm and about 3,000 rpm, about 3,000 rpm and about 10,000 rpm, about 3,000 rpm and about 10.000 rpm, or about 5.000 rpm and about 10,000 rpm.

In some embodiments, the at least one population of nanostructures is admixed with at least one organic resin for a time of between about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 20 hours, about 10 hours and about 15 hours, about 15 hours and about 24 hours, about 15 hours and about 20 hours, or about 20 hours and about 24 hours.

In some embodiments, the at least one population of nanostructures is admixed with at least one organic resin at a temperature between about −5° C. and about 100° C., about −5° C. and about 75° C., about −5° C. and about 50° C., about −5° C. and about 23° C., about 23° C. and about 100° C., about 23° C. and about 75° C., about 23° C. and about 50° C., about 50° C. and about 100° C., about 50° C. and about 75° C., or about 75° C. and about 100° C. In some embodiments, the at least one organic resin is admixed with the at least one population of nanostructures at a temperature between about 23° C. and about 50° C.

In some embodiments, if more than one organic resin is used, the organic resins are added together and mixed. In some embodiments, a first organic resin is mixed with a second organic resin at an agitation rate of between about 100 rpm and about 10,000 rpm, about 100 rpm and about 5,000 rpm, about 100 rpm and about 3,000 rpm, about 100 rpm and about 1,000 rpm, about 100 rpm and about 500 rpm, about 500 rpm and about 10,000 rpm, about 500 rpm and about 5,000 rpm, about 500 rpm and about 3,000 rpm, about 500 rpm and about 1,000 rpm, about 1,000 rpm and about 10,000 rpm, about 1,000 rpm and about 5,000 rpm, about 1,000 rpm and about 3,000 rpm, about 3,000 rpm and about 10,000 rpm, about 3,000 rpm and about 10,000 rpm, or about 5,000 rpm and about 10,000 rpm.

In some embodiments, a first organic resin is mixed with a second organic resin for a time of between about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 24 hours, about 10 hours and about 20 hours, about 10 hours and about 15 hours, about 15 hours and about 24 hours, about 15 hours and about 20 hours, or about 20 hours and about 24 hours.

Organic Resin

In some embodiments, the organic resin is a thermosetting resin or a ultraviolet (UV) curable resin. In some embodiments, the organic resin is cured by a method that facilitates roll-to-roll processing.

Thermosetting resins require curing in which they undergo an irreversible molecular cross-linking process which renders the resin infusible. In some embodiments, the thermosetting resin is an epoxy resin, a phenolic resin, a vinyl resin, a melamine resin, a urea resin, an unsaturated polyester resin, a polyurethane resin, an allyl resin, an acrylic resin, a polyamide resin, a polyamide-imide resin, a phenolamine condensation polymerization resin, a urea melamine condensation polymerization resin, or combinations thereof.

In some embodiments, the thermosetting resin is an epoxy resin. Epoxy resins are easily cured without evolution of volatiles or by-products by a wide range of chemicals. Epoxy resins are also compatible with most substrates and tend to wet surfaces easily. See Boyle, M. A., et al., "Epoxy Resins," Composites, Vol. 21, ASM Handbook, pages 78-89 (2001).

In some embodiments, the organic resin is a silicone thermosetting resin. In some embodiments, the silicone thermosetting resin is OE6630A or OE6630B (Dow Corning Corporation, Auburn, Mich.).

In some embodiments, a thermal initiator is used. In some embodiments, the thermal initiator is AIBN [2,2'-Azobis(2-methylpropionitrile)] or benzoyl peroxide.

UV curable resins are polymers that cure and quickly harden when exposed to a specific light wavelength. In some embodiments, the UV curable resin is a resin having as a functional group a radical-polymerization group such as a (meth)acrylyloxy group, a vinyloxy group, a styryl group, or a vinyl group; a cation-polymerizable group such as an epoxy group, a thioepoxy group, a vinyloxy group, or an oxetanyl group. In some embodiments, the UV curable resin is a polyester resin, a polyether resin, a (meth)acrylic resin, an epoxy resin, a urethane resin, an alkyd resin, a spiroacetal resin, a polybutadiene resin, or a polythiolpolyene resin.

In some embodiments, the UV curable resin is selected from the group consisting of urethane acrylate, allyloxylated cyclohexyl diacrylate, bis(acryloxy ethyl)hydroxyl isocyanurate, bis(acryloxy neopentylglycol)adipate, bisphenol A diacrylate, bisphenol A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, dipentaerythritol hexaacrylate, dipentaerythritol monohydroxy pentaacrylate, di(trimethylolpropane) tetraacrylate, ethyleneglycol dimethacrylate, glycerol methacrylate, 1,6-hexanediol diacrylate, neopentylglycol dimethacrylate, neopentylglycol hydroxypivalate diacrylate, pentaerythritol triacrylate, pentaerythritol tetraacrylate, phosphoric acid dimethacrylate, polyethyleneglycol diacrylate, polypropyleneglycol diacrylate, tetraethyleneglycol diacrylate, tetrabromobisphenol A diacrylate, triethyleneglycol divinylether, triglycerol diacrylate, trimethylolpropane triacrylate, tripropyleneglycol diacrylate, tris(acryloxyethyl) isocyanurate, phosphoric acid triacrylate, phosphoric acid diacrylate, acrylic acid propargyl ester, vinyl terminated polydimethylsiloxane, vinyl terminated diphenylsiloxane-dimethylsiloxane copolymer, vinyl terminated polyphenyl-methylsiloxane, vinyl terminated trifluoromethylsiloxane-dimethylsiloxane copolymer, vinyl terminated diethylsiloxane-dimethylsiloxane copolymer, vinylmethylsiloxane, monomethacryloyloxypropyl terminated polydimethyl siloxane, monovinyl terminated polydimethyl siloxane, monoallyl-mono trimethylsiloxy terminated polyethylene oxide, and combinations thereof.

In some embodiments, the UV curable resin is a mercapto-functional compound that can be cross-linked with an isocyanate, an epoxy, or an unsaturated compound under UV curing conditions. In some embodiments, the polythiol is pentaerythritol tetra(3-mercapto-propionate) (PETMP); trimethylol-propane tri(3-mercapto-propionate) (TMPMP); glycol di(3-mercapto-propionate) (GDMP); tris[25-(3-mercapto-propionyloxy)ethyl]isocyanurate (TEMPIC); di-pentaerythritol hexa(3-mercapto-propionate) (Di-PETMP); ethoxylated trimethylolpropane tri(3-mercapto-propionate) (ETTMP 1300 and ETTMP 700); polycaprolactone tetra(3-mercapto-propionate) (PCL4MP 1350); pentaerythritol tetramercaptoacetate (PETMA); trimethylol-propane trimercaptoacetate (TMPMA); or glycol dimercaptoacetate (GDMA). These compounds are sold under the trade name THIOCURE® by Bruno Bock, Marschacht, Germany.

In some embodiments, the UV curable resin is a polythiol. In some embodiments, the UV curable resin is a polythiol selected from the group consisting of ethylene glycol bis (thioglycolate), ethylene glycol bis(3-mercaptopropionate), trimethylol propane tris (thioglycolate), trimethylol propane tris (3-mercaptopropionate), pentaerythritol tetrakis (thioglycolate), pentaerythritol tetrakis(3-mercaptopropionate) (PETMP), and combinations thereof. In some embodiments, the UV curable resin is PETMP.

In some embodiments, the UV curable resin is a thiol-ene formulation comprising a polythiol and 1,3,5-Triallyl-1,3,5-triazine-2,4,6 (1H,3H,5H)-trione (TTT). In some embodiments, the UV curable resin is a thiol-ene formulation comprising PETMP and TTT.

In some embodiments, the UV curable resin further comprises a photoinitiator. A photoinitiator initiates the crosslinking and/or curing reaction of the photosensitive material during exposure to light. In some embodiments, the photoinitiator is acetophenone-based, benzoin-based, or thioxathenone-based.

In some embodiments, the photoinitiator is a vinyl acrylate-based resin. In some embodiments, the photoinitiator is MINS-311RM (Minuta Technology Co., Ltd, Korea).

In some embodiments, the photoinitiator is IRGACURE® 127, IRGACURE® 184, IRGACURE® 184D, IRGACURE® 2022, IRGACURE® 2100, IRGACURE® 250, IRGACURE® 270, IRGACURE® 2959, IRGACURE® 369, IRGACURE® 369 EG, IRGACURE® 379, IRGACURE® 500, IRGACURE® 651, IRGACURE® 754, IRGACURE® 784, IRGACURE® 819, IRGACURE® 819Dw, IRGACURE® 907, IRGACURE® 907 FF, IRGACURE® Oxe01, IRGACURE® TPO-L, IRGACURE® 1173, IRGACURE® 1173D, IRGACURE® 4265, IRGACURE® BP, or IRGACURE® MBF (BASF Corporation. Wyandotte, Mich.). In some embodiments, the photoinitiator is TPO (2,4,6-trimethylbenzoyl-diphenyl-phosphine oxide) or MBF (methyl benzoylformate).

In some embodiments, the weight percentage of the at least one organic resin in the nanostructure composition is between about 5% and about 99%, about 5% and about 95%, about 5% and about 90%, about 5% and about 80%, about 5% and about 70%, about 5% and about 60%, about 5% and about 50%, about 5% and about 40%, about 5% and about 30%, about 5% and about 20%, about 5% and about 10%, about 10% and about 99%, about 10% and about 95%, about 10% and about 90%, about 10% and about 80%, about 10% and about 70%, about 10% and about 60%, about 10% and about 50%, about 10% and about 40%, about 10% and about 30%, about 10% and about 20%, about 20% and about 99%, about 20% and about 95%, about 20% and about 90%, about 20% and about 80%, about 20% and about 70%, about 20% and about 60%, about 20% and about 50%, about 20% and about 40%, about 20% and about 30%, about 30% and about 99%, about 30% and about 95%, about 30% and about 90%, about 30% and about 80%, about 30% and about 70%, about 30% and about 60%, about 30% and about 50%, about 30% and about 40%, about 40% and about 99%, about 40% and about 95%, about 40%/0 and about 90%, about 40% and about 80%, about 40% and about 70%, about 40% and about 60%, about 40% and about 50%, about 50% and about 99%, about 50% and about 95%, about 50% and about 90%, about 50% and about 80%, about 50% and about 70%, about 50% and about 60%, about 60% and about 99%, about 60% and about 95%, about 60% and about 90%, about 60% and about 80%, about 60% and about 70%, about 70% and about 99%, about 70% and about 95%, about 70% and about 90%, about 70% and about 80%, about 80% and about 99%, about 80% and about 95%, about 80% and about 90%, about 90% and about 99%, about 90% and about 95%, or about 95% and about 99%.

Nanostructure Layer

The nanostructures used in the present invention can be embedded in a polymeric matrix using any suitable method. As used herein, the term "embedded" is used to indicate that the quantum dot population is enclosed or encased with the polymer that makes up the majority of the component of the matrix. The some embodiments, the at least one nanostructure population is suitably uniformly distributed throughout the matrix. In some embodiments, the at least one nanostructure population is distributed according to an application-specific distribution. In some embodiments, the nanostructures are mixed in a polymer and applied to the surface of a substrate.

In some embodiments, the present disclosure provides a nanostructure film layer comprising:
(a) at least one population of nanostructures, the nanostructures comprising a core surrounded by at least one shell, wherein the core comprises ZnTe and wherein the nanostructure exhibits an optical density at 450 nm on a per mass basis of between about 0.4 cm$^2$/mg and about 1.0 cm$^2$/mg; and
(b) at least one organic resin;
wherein the nanostructure film layer exhibits a photoconversion efficiency of between about 25% and about 40%.

In some embodiments, the present disclosure provides a nanostructure film layer comprising:
(a) at least one population of nanostructures, the nanostructures comprising a core surrounded by at least two shells, wherein the core comprises ZnTe and wherein the nanostructure exhibits an optical density at 450 nm on a per mass basis of between about 0.4 cm$^2$/mg and about 1.0 cm$^2$/mg; and
(b) at least one organic resin;
wherein the nanostructure film layer exhibits a photoconversion efficiency of between about 25% and about 40%.

In some embodiments, the nanostructure film layer is a color conversion layer.

The nanostructure composition can be deposited by any suitable method known in the art, including but not limited to painting, spray coating, solvent spraying, wet coating, adhesive coating, spin coating, tape-coating, roll coating, flow coating, inkjet vapor jetting, drop casting, blade coating, mist deposition, or a combination thereof. Preferably, the nanostructure composition is cured after deposition. Suitable curing methods include photo-curing, such as UV curing, and thermal curing. Traditional laminate film processing methods, tape-coating methods, and/or roll-to-roll fabrication methods can be employed in forming the quantum dot films of the present invention. The nanostructure composition can be coated directly onto the desired layer of a substrate. Alternatively, the nanostructure composition can be formed into a solid layer as an independent element and subsequently applied to the substrate. In some embodiments, the nanostructure composition can be deposited on one or more barrier layers.

Spin Coating

In some embodiments, the nanostructure composition is deposited onto a substrate using spin coating. In spin coating a small amount of material is typically deposited onto the center of a substrate loaded onto a machine called the spinner which is secured by a vacuum. A high speed of rotation is applied on the substrate through the spinner which causes centripetal force to spread the material from the center to the edge of the substrate. While most of the material is spun off, a certain amount remains of the substrate, forming a thin film of material on the surface as the rotation continues. The final thickness of the film is determined by the nature of the deposited material and the substrate in addition to the parameters chosen for the spin process such as spin speed, acceleration, and spin time. In some embodiments, a spin speed of 1500 to 6000 rpm is used with a spin time of 10-60 seconds.

Mist Deposition

In some embodiments, the nanostructure composition is deposited onto a substrate using mist deposition. Mist deposition takes place at room temperature and atmospheric pressure and allows precise control over film thickness by changing the process conditions. During mist deposition, a liquid source material is turned into a very fine mist and carried to the deposition chamber by nitrogen gas. The mist is then drawn to a wafer surface by a high voltage potential between the field screen and the wafer holder. Once the droplets coalesce on the wafer surface, the wafer is removed from the chamber and thermally cured to allow the solvent to evaporate. The liquid precursor is a mixture of solvent and material to be deposited. It is carried to the atomizer by pressurized nitrogen gas. Price, S. C., et al., "Formation of Ultra-Thin Quantum Dot Films by Mist Deposition," *ESC Transactions* 11:89-94 (2007).

Spray Coating

In some embodiments, the nanostructure composition is deposited onto a substrate using spray coating. The typical equipment for spray coating comprises a spray nozzle, an atomizer, a precursor solution, and a carrier gas. In the spray deposition process, a precursor solution is pulverized into micro sized drops by means of a carrier gas or by atomization (e.g., ultrasonic, air blast, or electrostatic). The droplets that come out of the atomizer are accelerated by the substrate surface through the nozzle by help of the carrier gas which is controlled and regulated as desired. Relative motion between the spray nozzle and the substrate is defined by design for the purpose of full coverage on the substrate.

In some embodiments, application of the nanostructure composition further comprises a solvent. In some embodiments, the solvent for application of the nanostructure composition is water, organic solvents, inorganic solvents, halogenated organic solvents, or mixtures thereof. Illustrative solvents include, but are not limited to, water, D$_2$O, acetone, ethanol, dioxane, ethyl acetate, methyl ethyl ketone, isopropanol, anisole, γ-butyrolactone, dimethylformamide, N-methylpyrrolidinone, dimethylacetamide, hexamethylphosphoramide, toluene, dimethylsulfoxide, cyclopentanone, tetramethylene sulfoxide, xylene, ε-caprolactone, tetrahydrofuran, tetrachloroethylene, chloroform, chlorobenzene, dichloromethane, 1,2-dichloroethane, 1,1,2,2-tetrachloroethane, or mixtures thereof.

In some embodiments, the nanostructure compositions are thermally cured to form the nanostructure layer. In some embodiments, the compositions are cured using UV light. In some embodiments, the nanostructure composition is coated directly onto a barrier layer of a nanostructure film, and an additional barrier layer is subsequently deposited upon the nanostructure layer to create the nanostructure film. A support substrate can be employed beneath the barrier film for added strength, stability, and coating uniformity, and to prevent material inconsistency, air bubble formation, and wrinkling or folding of the barrier layer material or other materials. Additionally, one or more barrier layers are preferably deposited over a nanostructure layer to seal the material between the top and bottom barrier layers. Suitably, the barrier layers can be deposited as a laminate film and optionally sealed or further processed, followed by incorporation of the nanostructure film into the particular lighting device. The nanostructure composition deposition process can include additional or varied components, as will be understood by persons of ordinary skill in the art. Such embodiments will allow for in-line process adjustments of the nanostructure emission characteristics, such as brightness and color (e.g., to adjust the quantum dot film white point), as well as the nanostructure film thickness and other characteristics. Additionally, these embodiments will allow for periodic testing of the nanostructure film characteristics during production, as well as any necessary toggling to achieve precise nanostructure film characteristics. Such testing and adjustments can also be accomplished without changing the mechanical configuration of the processing line, as a computer program can be employed to electronically change the respective amounts of mixtures to be used in forming a nanostructure film.

Nanostructure Film Features and Embodiments

In some embodiments, the nanostructure film layers of the present invention are used to form display devices. As used herein, a display device refers to any system with a lighting display. Such devices include, but are not limited to, devices encompassing a liquid crystal display (LCD), televisions, computers, mobile phones, smart phones, personal digital assistants (PDAs), gaming devices, electronic reading devices, digital cameras, and the like.

In some embodiments, the optical films containing nanostructure compositions are substantially free of cadmium. As used herein, the term "substantially free of cadmium" is intended that the nanostructure compositions contain less than 100 ppm by weight of cadmium. The RoHS compliance definition requires that there must be no more than 0.01% (100 ppm) by weight of cadmium in the raw homogeneous precursor materials. The cadmium concentration can be measured by inductively coupled plasma mass spectroscopy (ICP-MS) analysis, and are on the parts per billion (ppb) level. In some embodiments, optical films that are "substantially free of cadmium" contain 10 to 90 ppm cadmium. In other embodiment, optical films that are substantially free of cadmium contain less than about 50 ppm, less than about 20 ppm, less than about 10 ppm, or less than about 1 ppm of cadmium.

Nanostructure Molded Article

In some embodiments, the present disclosure provides a nanostructure molded article comprising:
(a) a first barrier layer;
(b) a second barrier layer; and
(c) a nanostructure layer between the first barrier layer and the second barrier layer, wherein the nanostructure layer comprises a population of nanostructures comprising a core surrounded by at least one shell, wherein the core comprises ZnTe and wherein the nanostructure exhibits an optical density at 450 nm on a per mass basis of between about 0.4 cm$^2$/mg and about 1.0 cm$^2$/mg; and at least one organic resin.

In some embodiments, the nanostructure molded article exhibits a photoconversion efficiency of between about 25% and about 40%.

Barrier Layers

In some embodiments, the nanostructure molded article comprises one or more barrier layers disposed on either one or both sides of the nanostructure layer. Suitable barrier layers protect the nanostructure layer and the nanostructure molded article from environmental conditions such as high temperatures, oxygen, and moisture. Suitable barrier materials include non-yellowing, transparent optical materials which are hydrophobic, chemically and mechanically compatible with the nanostructure molded article, exhibit photo- and chemical-stability, and can withstand high temperatures. Preferably, the one or more barrier layers are index-matched to the nanostructure molded article. In preferred embodiments, the matrix material of the nanostructure molded article and the one or more adjacent barrier layers are index-matched to have similar refractive indices, such that most of the light transmitting through the barrier layer toward the nanostructure molded article is transmitted from the barrier layer into the nanostructure layer. This index-matching reduces optical losses at the interface between the barrier and matrix materials.

The barrier layers are suitably solid materials, and can be a cured liquid, gel, or polymer. The barrier layers can comprise flexible or non-flexible materials, depending on the particular application. Barrier layers are preferably planar layers, and can include any suitable shape and surface area configuration, depending on the particular lighting application. In preferred embodiments, the one or more barrier layers will be compatible with laminate film processing techniques, whereby the nanostructure layer is disposed on at least a first barrier layer, and at least a second barrier layer is disposed on the nanostructure layer on a side opposite the nanostructure layer to form the nanostructure molded article according to one embodiment of the present invention. Suitable barrier materials include any suitable barrier materials known in the art. For example, suitable barrier materials include glasses, polymers, and oxides. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. Preferably, each barrier layer of the nanostructure molded article comprises at least 2 layers comprising different materials or compositions, such that the multi-layered barrier eliminates or reduces pinhole defect alignment in the barrier layer, providing an effective barrier to oxygen and moisture penetration into the nanostructure layer. The nanostructure layer can include any suitable material or combination of materials and any suitable number of barrier layers on either or both sides of the nanostructure layer. The materials, thickness, and number of barrier layers will depend on the particular application, and will suitably be chosen to maximize barrier protection and brightness of the nanostructure layer while minimizing thickness of the nanostructure molded article. In preferred embodiments, each barrier layer comprises a laminate film, preferably a dual laminate film, wherein the thickness of each barrier layer is sufficiently thick to eliminate wrinkling in roll-to-roll or laminate manufacturing processes. The number or thickness of the barriers may further depend on legal toxicity guidelines in embodiments where the nanostructures comprise heavy metals or other toxic materials, which guidelines may require more or thicker barrier layers. Additional considerations for the barriers include cost, availability, and mechanical strength.

In some embodiments, the nanostructure film comprises two or more barrier layers adjacent each side of the nanostructure layer, for example, two or three layers on each side or two barrier layers on each side of the nanostructure layer. In some embodiments, each barrier layer comprises a thin glass sheet, e.g., glass sheets having a thickness of about 100 μm, 100 μm or less, or 50 μm or less.

Each barrier layer of the nanostructure film of the present invention can have any suitable thickness, which will depend on the particular requirements and characteristics of the lighting device and application, as well as the individual film components such as the barrier layers and the nanostructure layer, as will be understood by persons of ordinary skill in the art. In some embodiments, each barrier layer can have a thickness of 50 µm or less, 40 µm or less, 30 µm or less, 25 µm or less, 20 µm or less, or 15 µm or less. In certain embodiments, the barrier layer comprises an oxide coating, which can comprise materials such as silicon oxide, titanium oxide, and aluminum oxide (e.g., $SiO_2$, $Si_2O_3$, $TiO_2$, or $Al_2O_3$). The oxide coating can have a thickness of about 10 µm or less, 5 µm or less, 1 µm or less, or 100 nm or less. In certain embodiments, the barrier comprises a thin oxide coating with a thickness of about 100 nm or less, 10 nm or less, 5 nm or less, or 3 nm or less. The top and/or bottom barrier can consist of the thin oxide coating, or may comprise the thin oxide coating and one or more additional material layers.

Nanostructure Molded Article Properties

In some embodiments, the nanostructure is a core/shell nanostructure. In some embodiments, the nanostructure is a ZnTe/ZnSe or ZnTe/ZnSe/ZnS nanostructure.

In some embodiments, the nanostructure molded article is a nanostructure film.

The photoluminescence spectrum of the nanostructure molded article can cover essentially any desired portion of the spectrum. In some embodiments, the photoluminescence spectrum for the nanostructure molded article has an emission maximum between 300 nm and 750 nm, 300 nm and 650 nm, 300 nm and 550 nm, 300 nm and 450 nm, 450 nm and 750 nm, 450 nm and 650 nm, 450 nm and 550 nm, 450 nm and 750 nm, 450 nm and 650 nm, 450 nm and 550 nm, 550 nm and 750 nm, 550 nm and 650 nm, or 650 nm and 750 nm. In some embodiments, the photoluminescence spectrum for the nanostructure molded article has an emission maximum of between 450 nm and 550 nm.

The size distribution of the nanostructure molded article can be relatively narrow. In some embodiments, the photoluminescence spectrum of the nanostructure molded article has a full width at half maximum of between 10 nm and 60 nm, 10 nm and 40 nm, 10 nm and 30 nm, 10 nm and 20 nm, 20 nm and 60 nm, 20 nm and 40 nm, 20 nm and 30 nm, 30 nm and 60 nm, 30 nm and 40 nm, or 40 nm and 60 nm. In some embodiments, the photoluminescence spectrum of the population of nanostructures can have a full width at half maximum of between 33 nm and 34 nm.

In some embodiments, the nanostructure molded article emits light having a peak emission wavelength (PWL) between about 400 nm and about 650 nm, about 400 nm and about 600 nm, about 400 nm and about 550 nm, about 400 nm and about 500 nm, about 400 nm and about 450 nm, about 450 nm and about 650 nm, about 450 nm and about 600 nm, about 450 nm and about 550 nm, about 450 nm and about 500 nm, about 500 nm and about 650 nm, about 500 nm and about 600 nm, about 500 nm and about 550 nm, about 550 nm and about 650 nm, about 550 nm and about 600 nm, or about 600 nm and about 650 nm. In some embodiments, the nanostructures emit light having a PWL between about 500 nm and about 550 nm.

In some embodiments, the nanostructure molded article displays a high photoconversion efficiency (PCE). In some embodiments, the nanostructure molded article display a PCE of between about 25% and about 40%, about 25% and about 35%, about 25% and about 30%, about 25% and about 28%, about 28% and about 40%, about 28% and about 35%, about 28% and about 30%, about 30% and about 40%, about 30% and about 35%, or about 35% and about 40%. In some embodiments, the nanostructure molded articles display a PCE of between about 28% and about 30%.

In some embodiments, the nanostructure molded article displays an optical density at 450 nm of between about 0.80 and about 0.99, about 0.80 and about 0.95, about 0.80 and about 0.90, about 0.80 and about 0.85, about 0.85 and about 0.99, about 0.85 and about 0.95, about 0.85 and about 0.90, about 0.90 and about 0.99, about 0.90 and about 0.95, or about 0.95 and about 0.99. In some embodiments, the nanostructure molded article displays an optical density at 450 nm of between about 0.80 and about 0.95. In some embodiments, the nanostructure molded article displays an optical density at 450 nm of between about 0.85 and about 0.95.

Display Device with Nanostructure Color Conversion Layer

In some embodiments, the present invention provides a display device comprising:
(a) a display panel to emit a first light;
(b) a backlight unit configured to provide the first light to the display panel; and
(c) a color filter comprising at least one pixel region comprising a color conversion layer.

In some embodiments, the color filter comprises at least 1, 2, 3, 4, 5, 6, 7, 8, 9, or 10 pixel regions. In some embodiments, when blue light is incident on the color filter, red light, white light, green light, and/or blue light may be respectively emitted through the pixel regions. In some embodiments, the color filter is described in U.S. Patent Appl. Publication No. 2017/153366, which is incorporated herein by reference in its entirety.

In some embodiments, each pixel region includes a color conversion layer. In some embodiments, a color conversion layer comprises nanostructures described herein configured to convert incident light into light of a first color. In some embodiments, the color conversion layer comprises nanostructures described herein configured to convert incident light into blue light.

In some embodiments, the display device comprises 1, 2, 3, 4, 5, 6, 7, 8, 9, or 10 color conversion layers. In some embodiments, the display device comprises 1 color conversion layer comprising the nanostructures described herein. In some embodiments, the display device comprises 2 color conversion layers comprising the nanostructures described herein. In some embodiments, the display device comprises 3 color conversion layers comprising the nanostructures described herein. In some embodiments, the display device comprises 4 color conversion layers comprising the nanostructures described herein. In some embodiments, the display device comprises at least one red color conversion layer, at least one green color conversion layer, and at least one blue color conversion layer.

In some embodiments, the color conversion layer has a thickness between about 3 µm and about 10 µm, about 3 µm and about 8 µm, about 3 µm and about 6 µm, about 6 µm and about 10 µm, about 6 µm and about 8 µm, or about 8 µm and about 10 µm. In some embodiments, the color conversion layer has a thickness between about 3 µm and about 10 µm.

The nanostructure color conversion layer can be deposited by any suitable method known in the art, including but not limited to painting, spray coating, solvent spraying, wet coating, adhesive coating, spin coating, tape-coating, roll coating, flow coating, inkjet printing, photoresist patterning, drop casting, blade coating, mist deposition, or a combination thereof. In some embodiments, the nanostructure color conversion layer is deposited by photoresist patterning. In some embodiments, nanostructure color conversion layer is deposited by inkjet printing.

Inkjet Printing

The formation of thin films using dispersions of nanostructures in organic solvents is often achieved by coating techniques such as spin coating. However, these coating techniques are generally not suitable for the formation of thin films over a large area and do not provide a means to pattern the deposited layer and thus, are of limited use. Inkjet printing allows for precisely patterned placement of thin films on a large scale at low cost. Inkjet printing also allows for precise patterning of nanostructure layers, allows printing pixels of a display, and eliminates photopatterning. Thus, inkjet printing is very attractive for industrial application— particularly in display applications.

Solvents commonly used for inkjet printing are dipropylene glycol monomethyl ether acetate (DPMA), polyglycidyl methacrylate (PGMA), diethylene glycol monoethyl ether acetate (EDGAC), and propylene glycol methyl ether acetate (PGMEA). Volatile solvents are also frequently used in inkjet printing because they allow rapid drying. Volatile solvents include ethanol, methanol, 1-propanol, 2-propanol, acetone, methyl ethyl ketone, methyl isobutyl ketone, ethyl acetate, and tetrahydrofuran. Conventional nanostructures generally cannot be dissolved in these solvents. However, the increased hydrophilicity of the nanostructures comprising poly(alkylene oxide) ligands allows for increased solubility in these solvents.

In some embodiments, the nanostructures described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, chloroform, chlorobenzene, cyclohexane, hexane, heptane, octane, hexadecane, undecane, decane, dodecane, xylene, toluene, benzene, octadecane, tetradecane, butyl ether, or combinations thereof. In some embodiments, the nanostructures comprising a poly(alkylene oxide) ligands described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, or combinations thereof.

In order to be applied by inkjet printing or microdispensing, the inkjet compositions comprising nanostructures should be dissolved in a suitable solvent. The solvent must be able to disperse the nanostructure composition and must not have any detrimental effect on the chosen print head.

In some embodiments, the inkjet composition further comprises one or more additional components such as surface-active compounds, lubricating agents, wetting agents, dispersing agents, hydrophobing agents, adhesive agents, flow improvers, defoaming agents, deaerators, diluents, auxiliaries, colorants, dyes, pigments, sensitizers, stabilizers, and inhibitors.

In some embodiments, the nanostructure compositions described herein comprise by weight of the inkjet composition between about 0.01% and about 20%. In some embodiments, the nanostructures comprising poly(alkylene oxide) ligands comprise by weight of the inkjet composition between about 0.01% and about 20%, about 0.01% and about 15%, about 0.01% and about 10%, about 0.01% and about 5%, about 0.01% and about 2%, about 0.01% and about 1%, about 0.01% and about 0.1%, about 0.01% and about 0.05%, about 0.05% and about 20%, about 0.05% and about 15%, about 0.05% and about 10%, about 0.05% and about 5%6, about 0.05% and about 2%, about 0.05% and about 1%, about 0.05% and about 0.1%, about 0.1% and about 20%, about 0.1% and about 15%, about 0.1% and about 10%, about 0.1% and about 5%, about 0.1% and about 2%, about 0.1% and about 1%, about 0.5% and about 20%, about 0.5% and about 15%, about 0.5% and about 10%, about 0.5% and about 5%, about 0.5% and about 2%, about 0.5% and about 1%, about 1% and about 20%, about 1% and about 15%, about 1% and about 10%, about 1% and about 5%, about 1% and about 2%, about 2% and about 20%, about 2% and about 15%, about 2% and about 10%, about 2% and about 5%, about 5% and about 20%, about 5% and about 15%, about 5% and about 10%, about 10% and about 20%, about 10% and about 15%, or about 15% and 20%.

In some embodiments, the inkjet composition comprising a nanostructure or a nanostructure composition described herein is used in the formulation of an electronic device. In some embodiments, the inkjet composition comprising a nanostructure or a nanostructure composition described herein is used in the formulation of an electronic device selected from the group consisting of a nanostructure film, a display device, a lighting device, a backlight unit, a color filter, a surface light-emitting device, an electrode, a magnetic memory device, or a battery. In some embodiments, the inkjet composition comprising a nanostructure composition described herein is used in the formulation of a light-emitting device.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

Synthesis of ZnTe Core

In a typical synthesis, 24 mL benzyl ether was loaded to a flask that contains degassed 9 grams zinc oleate and 0.9 grams lauric acid. The flask was degassed at 100° C. for 30 minutes and then heated to 245° C., over 22 minutes. In a glovebox, telluride was prepared from 7.2 mL of 1 M LiEt$_3$BH in benzyl ether and 4.77 mL of 1.5 M TOP-Te (Te in trioctylphosphine) solution. The telluride stock was injected into the reaction flask, and the temperature was maintained at 245-250° C. to form ZnTe nanocrystals. After 3 minutes hold, 10 mL of oleylamine and 10 mL of trioctylphosphine were added. At 100° C., 30 mL of toluene was added, and the reaction mixture was transferred to a glovebox. The final product was precipitated by adding 1.5× ethanol per total volume of product, centrifuged, and redispersed in hexane.

Example 2

Synthesis of ZnTe Core

A ZnTe core was synthesized according to the same method used in Example 1 except holding time at 245-250° C. was 5 minutes.

Example 3

Synthesis of ZnTe Core

A ZnTe core was synthesized according to the same method used in Example 1 except no oleylamine and trioctylphosphine were added after the target wavelength is reached.

Example 4

Synthesis of ZnTe Core

ZnTe core is synthesized according to the same method used in Example 1 except no oleylamine and no trioctylphosphine were added after the target wavelength was reached and holding time at 245-250° C. was 5 minutes.

Example 5

Synthesis of ZnTe Core

A ZnTe core was synthesized according to the same method used in Example 1 except no lauric acid, no oleylamine, and no trioctylphosphine were added. Reaction time at 245-250° C. was 5 minutes.

Example 6

Characterization of ZnTe Cores

The exciton absorption wavelength (Abs), half-width at half-maximum (HWHM, and v/p (v/p=(Abs valley)/(Abs max) for the ZnTe cores prepared in Examples 1-5 is shown in Table 1.

TABLE 1

UV-Vis Date of ZnTe Cores

| Example | Abs (nm) | HWHM (nm) | v/p |
|---|---|---|---|
| Example 1 | 430.4 | 16.3 | 0.87 |
| Example 2 | 453.1 | 20.4 | 0.97 |
| Example 3 | 426.6 | 19.3 | 0.86 |
| Example 4 | 456.0 | 19.18 | 0.95 |
| Example 5 | 457.3 | 20.1 | 0.96 |

Example 7

ZnTe/ZnSe Shell Synthesis

A typical synthesis is the following: 0.6 grams zinc oleate, 6 mL oleylamine, and 40 mL trioctylphosphine (TOP) were introduced to a flask and degassed under vacuum at 90° C. for 30 minutes. Under nitrogen, 0.12 grams $ZnCl_2$ and 0.5 mL oleic acid were added, and then 0.077 grams ZnTe core was injected at 110° C. For the growth of ZnSe, the temperature was increased to 240° C. and 0.1 mL of 1.92 M TOP-Se (Se in trioctylphosphine) was added. After the reaction mixture was stirred for 25 minutes, the temperature was ramped to 260° C. and held until the target peak wavelength reached, then cooled to 180° C. and quenched with 10 mL TOP. The final product was transferred to a glovebox, diluted with one volume toluene, precipitated with ethanol, centrifuged, and redispersed in hexane.

Example 8

ZnTe/ZnSe Shell Synthesis 1.52 grams zinc oleate, 6 mL oleylamine, and 40 mL TOP were introduced to a flask and degassed under vacuum at 90° C. for 30 minutes. Under nitrogen, 0.12 grams $ZnCl_2$ and 0.5 mL oleic acid were added, and then 0.077 grams ZnTe core was injected at 110° C. For the growth of ZnSe, temperature was increased to 240° C. and 0.29 mL of 1.92 M TOP-Se was added. After the reaction mixture was stirred for 25 minutes it was ramped to 260° C. and held until the target peak wavelength was reached, then cooled to 180° C. and quenched with 10 mL TOP. The final product was transferred to a glovebox, diluted with one volume toluene, precipitated with ethanol, centrifuged, and redispersed in hexane.

Example 9

ZnTe/ZnSe Shell Synthesis 2.28 grams zinc oleate, 6 mL oleylamine, and 40 mL TOP were introduced to a flask and degassed under vacuum at 90° C. for 30 minutes. Under nitrogen, 0.12 grams $ZnCl_2$ and 0.5 mL oleic acid were added, and then 0.077 grams ZnTe core was injected at 110° C. For the growth of ZnSe, temperature was increased to 240° C. and 0.39 mL of 1.92 M TOP-Se was added. The reaction mixture was stirred for 50 minutes, then cooled to 180° C. and quenched with 10 mL TOP. The final product was transferred to a glovebox, diluted with one volume toluene, precipitated with ethanol, centrifuged, and redispersed in hexane.

Example 10

Characterization of Zn/Te Core/Shells

The peak emission wavelength (PWL), full-width at half-maximum (FWHM), quantum yield (QY), and optical density at 450 per mass ($OD_{450}$/mass) for the ZnTe/ZnSe core/shell quantum dots prepared in Examples 7-9 is shown in Table 2.

TABLE 2

Analytical Data for ZnTe/ZnSe Quantum Dots

| Example ID | PWL (nm) | FHWM (nm) | QY (%) | $OD_{450}$/Mass |
|---|---|---|---|---|
| Example 7 | 535 | 37.1 | 38 | 0.51 |
| Example 8 | 523 | 32.9 | 40 | 0.49 |
| Example 9 | 507 | 30.5 | 45 | 0.47 |

Example 11

ZnTe/ZnSe/ZnS Shell Synthesis 0.29 grams zinc formate, 6 mL oleylamine and 40 mL TOP are introduced to a flask and degassed under vacuum at 90° C. for 30 minutes. Under nitrogen, 0.12 grams $ZnCl_2$ and 0.5 mL oleic acid are added, and 0.077 grams ZnTe core is injected at 110° C. For the growth of ZnSe, the temperature is increased to 240° C. and 0.11 mL of 1.92M TOP-Se is added. After the reaction mixture is stirred for 25 min, the temperature is ramped to 260° C. and held for 25 min. Then 0.08 grams of 1-Hexyl-3,3-dibutylthiourea was added. After 25 min the reaction is cooled to 180° C. and 10 mL TOP is added. The final product is transferred to a glovebox, diluted with one volume toluene and precipitated with ethanol, centrifuged, and redispersed in hexane.

Example 12

ZnTe/ZnSe/ZnS Shell Synthesis 0.64 grams zinc oleate, 6 mL oleylamine, and 40 mL TOP were introduced to a flask and degassed under vacuum at 90° C. for 30 minutes. Under nitrogen, 0.12 grams $ZnCl_2$ and 0.5 mL oleic acid were added, and then 0.077 grams ZnTe core was injected at 110° C. For the growth of ZnSe, the temperature was increased to 240° C. and 0.11 mL of 1.92 M TOP-Se was added. After the reaction mixture was stirred for 25 minutes, the temperature was ramped to 260° C. and held for 25 minutes. Then 0.05 mL of dodecanethiol (DDT) was added. After 25 minutes stirring, the reaction was cooled to 180° C. and 10 mL TOP was added. The final product was transferred to a glovebox, diluted with one volume toluene, precipitated with ethanol, centrifuged, and redispersed in hexane.

Example 13

ZnTe/ZnSe/ZnS Shell Synthesis 0.78 grams zinc oleate, 6 mL oleylamine, and 40 mL TOP were introduced to a flask and degassed under vacuum at 90° C. for 30 minutes. Under nitrogen, 0.12 grams $ZnCl_2$ and 0.5 mL oleic acid were added, and then 0.077 grams ZnTe core was injected at 110° C. For the growth of ZnSe, the temperature was increased to 240° C. and 0.19 mL of 1.92 M TOP-Se was added. After the reaction mixture was stirred for 25 minutes, the temperature was ramped to 260° C. and held for 25 minutes. Then 0.07 mL of tert-dodecylmercaptan was added. After 25 minutes stirring, the reaction was cooled to 180° C. and 10 mL TOP was added. The final product was transferred to a glovebox, diluted with one volume toluene, precipitated with ethanol, centrifuged, and redispersed in hexane.

Example 14

ZnTe/ZnSe/ZnS Shell Synthesis 0.58 grams zinc oleate, 6 mL oleylamine, and 40 mL TOP were introduced to a flask and degassed under vacuum at 90° C. for 30 minutes. Under nitrogen, 0.12 grams $ZnCl_2$, 0.5 mL oleic acid, and 1.8 mL of 1% Br-Methanol were added, and then 0.077 grams ZnTe core was injected at 110° C. For the growth of ZnSe, the temperature was increased to 240° C. and 0.19 mL of 1.92 M TOP-Se was added. After the reaction mixture was stirred for 25 minutes, the temperature was ramped to 260° C. and held for 25 minutes. Then 0.05 mL of DDT was added. After 25 minutes stirring, the reaction was cooled to 180° C. and 10 mL TOP was added. The final product was transferred to a glovebox, diluted with one volume toluene, precipitated with ethanol, centrifuged, and redispersed in hexane.

Example 15

ZnTe/ZnSe/ZnS Shell Synthesis 1.04 grams zinc oleate, 6 mL oleylamine, and 40 mL TOP were introduced to a flask and degassed under vacuum at 90° C. for 30 minutes. Under nitrogen, 0.12 grams $ZnCl_2$ and 0.5 mL oleic acid were added, and then 0.077 grams ZnTe core was injected at 110° C. For the growth of ZnSe, the temperature was increased to 240° C. and 0.11 mL of 1.92 M TOP-Se was added. After the reaction mixture was stirred for 25 minutes, the temperature was ramped to 260° C. and held for 25 minutes. Then 0.04 grams of zinc diethyldithiocarbamate was added. After 25 minutes stirring, the reaction was cooled to 180° C. and 10 mL TOP was added. The final product was transferred to a glovebox, diluted with one volume toluene, precipitated with ethanol, centrifuged, and redispersed in hexane.

Example 16

ZnTe/ZnSe/ZnS Shell Synthesis 2.9 grams zinc oleate and 80 mL ODE were added to a flask and degassed under vacuum at 90° C. for 30 minutes. Under nitrogen, 0.12 grams $ZnCl_2$ was added, the temperature was ramped to 110° C., then 0.154 grams ZnTe core and 0.2 mL of 1.92 M TOP-Se were injected simultaneously. The temperature was increased to 270° C. and 0.19 mL TOP-Se was added. Immediately, after Se addition was complete, 0.23 mL dodecanethiol was injected. After 25 minutes stirring, the reaction was cooled to 180° C. and 4 mL TOP was added. The final product was transferred to a glovebox, diluted with one volume toluene, precipitated with ethanol, centrifuged, and redispersed in hexane.

Example 17

Characterization of ZnTe/ZnSe/ZnS Core/Shell/Shell Quantum Dots

The peak emission wavelength (PWL), full-width at half-maximum (FWHM), quantum yield (QY), and optical density at 450 per mass ($OD_{450}$/mass) for the ZnTe/ZnSe/ZnS core/shell/shell quantum dots prepared in Examples 11-16 is shown in Table 3.

TABLE 3

Analytical Data for ZnTe/ZnSe/ZnS Quantum Dots

| Example ID | PWL (nm) | FHWM (nm) | QY (%) | $OD_{450}$/ Mass |
|---|---|---|---|---|
| Example 11 | 520 | 37 | 50 | 0.86 |
| Example 12 | 528 | 34 | 56 | 0.82 |
| Example 13 | 516 | 33 | 60 | 0.79 |
| Example 14 | 529 | 34 | 48 | 0.89 |
| Example 15 | 528 | 38 | 59 | 0.48 |
| Example 16 | 525 | 58 | 38 | 0.51 |

Having now fully described this invention, it will be understood by those of ordinary skill in the art that the same can be performed within a wide and equivalent range of conditions, formulations and other parameters without affecting the scope of the invention or any embodiment thereof. All patents, patent applications, and publications cited herein are fully incorporated by reference herein in their entirety.

What is claimed is:

1. A nanostructure comprising a core surrounded by at least one shell, wherein the core comprises ZnTe and wherein the nanostructure exhibits an optical density at 450 nm on a per mass basis of between about 0.4 $cm^2$/mg and about 1.5 $cm^2$/mg.

2. The nanostructure of claim 1, wherein the peak emission wavelength of the nanostructure is between about 510 nm and about 530 nm.

3. The nanostructure of claim 1, wherein the photoluminescence quantum yield of the nanostructure is between 20% and 99%.

4. The nanostructure of claim 1, wherein the FWHM of the nanostructure is between about 30 nm and about 40 nm.

5. The nanostructure of claim 1, wherein the nanostructure exhibits an optical density at 450 nm on a per mass basis of between about 0.45 cm$^2$/mg and about 0.9 cm$^2$/mg.

6. The nanostructure of claim 1, wherein the nanostructure comprises two shells, wherein the first shell comprises ZnSe and the second shell comprises ZnS.

7. A device comprising the nanostructure of claim 1.

8. A method of producing a nanostructure comprising a ZnTe core surrounded by at least one shell comprising:
  a. admixing a first zinc source and at least one solvent to produce a reaction mixture;
  b. contacting the reaction mixture obtained in (a) with a solution comprising a reducing agent and a tellurium source;
  c. admixing a second zinc source and at least one ligand to produce a reaction mixture;
  d. admixing the reaction mixture of (b) with the reaction mixture of (c); and
  e. contacting the reaction mixture obtained in (d) with a selenium source;

to produce a nanostructure comprising a ZnTe core surrounded by at least one shell, wherein the nanostructure exhibits an optical density at 450 nm on a per mass basis of between about 0.4 cm$^2$/mg and about 1.5 cm$^2$/mg.

9. The method of claim 8, wherein the first zinc source is a zinc carboxylate.

10. The method of claim 8, the at least one solvent in (a) is octadecene or benzyl ether.

11. The method of claim 8, wherein the admixing in (a) further comprises admixing the ligand lauric acid.

12. The method of claim 8, wherein the tellurium source in (b) is selected from the group consisting of trioctylphosphine telluride, tri-n-butylphosphine telluride, trimethylphosphine telluride, triphenylphosphine telluride, tricyclohexylphosphine telluride, elemental tellurium, hydrogen telluride, bis(trimethylsilyl) telluride, and mixtures thereof.

13. The method of claim 8, wherein the reducing agent in (b) is selected from the group consisting of diborane, sodium hydride, sodium borohydride, lithium borohydride, sodium cyanoborohydride, calcium hydride, lithium hydride, lithium aluminum hydride, diisobutylaluminum hydride, sodium triethylborohydride, and lithium triethylborohydride.

14. The method of claim 8, wherein the second zinc source is a zinc carboxylate.

15. The method of claim 8, wherein the at least one ligand in (c) is oleylamine.

16. The method of claim 8, wherein the selenium source in (e) is trioctylphosphine selenide.

17. The method of claim 8, further comprising:
  (f) contacting the reaction mixture in (e) with a sulfur source.

18. The method of claim 17, wherein the sulfur source in (f) is selected from the group consisting of elemental sulfur, octanethiol, dodecanethiol, octadecanethiol, tributylphosphine sulfide, cyclohexyl isothiocyanate, a-toluenethiol, ethylene trithiocarbonate, allyl mercaptan, bis(trimethylsilyl) sulfide, trioctylphosphine sulfide, and mixtures thereof.

19. A nanostructure composition, comprising:
  a. at least one population of nanostructures, the nanostructures comprising a core and at least one shell, wherein the core comprises ZnTe and wherein the nanostructure exhibits an optical density at 450 nm on a per mass basis of between about 0.4 cm$^2$/mg and about 1.5 cm$^2$/mg; and
  b. at least one organic resin.

20. A molded article comprising the nanostructure composition of claim 19.

* * * * *